(12) United States Patent
Nan et al.

(10) Patent No.: US 12,432,894 B2
(45) Date of Patent: Sep. 30, 2025

(54) APPARATUS AND METHOD FOR UNPACKING COMPONENTS IN TAPE-AND-REEL

(71) Applicant: Diodes Incorporated, Plano, TX (US)

(72) Inventors: Jiang Nan, Chengdu (CN); Fei Huang, Chengdu (CN); Yaping Yang, Chengdu (CN)

(73) Assignee: Diodes Incorporated, Plano, TX (US)

( * ) Notice: Subject to any disclaimer, the term of this patent is extended or adjusted under 35 U.S.C. 154(b) by 0 days.

(21) Appl. No.: 18/737,875

(22) Filed: Jun. 7, 2024

(65) Prior Publication Data

US 2025/0040113 A1    Jan. 30, 2025

(30) Foreign Application Priority Data

Jul. 28, 2023 (CN) .......................... 202322019387.2

(51) Int. Cl.
*B23P 19/02* (2006.01)
*B29B 17/02* (2006.01)
(Continued)

(52) U.S. Cl.
CPC .......... *H05K 13/021* (2013.01); *B23P 19/025* (2013.01); *H05K 13/0084* (2013.01); *B29B 2017/0217* (2013.01); *Y10T 29/49755* (2015.01); *Y10T 29/49819* (2015.01); *Y10T 29/49821* (2015.01); *Y10T 29/49822* (2015.01);
(Continued)

(58) Field of Classification Search
CPC ......... Y10T 29/53465; Y10T 29/49819; Y10T 29/49821; Y10T 29/49822; Y10T 29/49824; Y10T 29/49755; Y10T 156/1168; B23P 19/025; B29B 2017/0217; H05K 13/0084; H05K 13/021
See application file for complete search history.

(56) References Cited

U.S. PATENT DOCUMENTS 6,402,452 B1 * 6/2002 Miller ................ H05K 13/0419
                                                    414/412
11,217,473 B1 * 1/2022 Zhang ................... B32B 43/006
(Continued)

FOREIGN PATENT DOCUMENTS

CN      107978954 A  *  5/2018    ............ H01R 43/16
CN      114834714 A  *  8/2022    ............ B65B 69/00
(Continued)

*Primary Examiner* — Jermie E Cozart
(74) *Attorney, Agent, or Firm* — AP3 Law Firm PLLC

(57) ABSTRACT

A device is provided for unpackaging components encased between a first tape body and a second tape body of a sealed tape. The device includes a component collection device including a cavity for receiving components falling out of the sealed tape being de-taped. A de-taping device is attached to the component collection device. The de-taping device includes a support base held over the cavity, and a shaft on one side of the support base. The support base with the shaft is configured to enable one of the first tape body and the second tape body to be extendable around the shaft and the support base and to be pullable, such that the first tape body and the second tape body are separated and the components fall out of the sealed tape. The support base may include a through-hole configured for sealed tapes to pass through and to be held.

20 Claims, 20 Drawing Sheets

(51) Int. Cl.
*H05K 13/00* (2006.01)
*H05K 13/02* (2006.01)

(52) U.S. Cl.
CPC .... *Y10T 29/49824* (2015.01); *Y10T 29/53465* (2015.01)

(56) References Cited

U.S. PATENT DOCUMENTS

| | | | | |
|---|---|---|---|---|
| 2002/0092883 | A1* | 7/2002 | Andersson | H05K 13/0053 226/152 |
| 2005/0034577 | A1* | 2/2005 | Au | H01L 21/67144 83/13 |
| 2014/0060749 | A1* | 3/2014 | Choi | H05K 13/0417 156/719 |
| 2023/0060138 | A1* | 3/2023 | Shimomura | A01D 46/24 |

FOREIGN PATENT DOCUMENTS

| | | | | | |
|---|---|---|---|---|---|
| EP | 1530414 | A1 | * | 5/2005 | ......... H05K 13/0419 |
| JP | 2001028495 | A | * | 1/2001 | |
| JP | 2005222991 | A | * | 8/2005 | |
| KR | 19990047520 | A | * | 7/1999 | |
| KR | 20110029715 | A | * | 3/2011 | ........... H05K 13/021 |
| WO | WO-02054848 | A1 | * | 7/2002 | ........... H05K 13/021 |
| WO | WO-2014097473 | A1 | * | 6/2014 | ........... H05K 13/021 |

\* cited by examiner

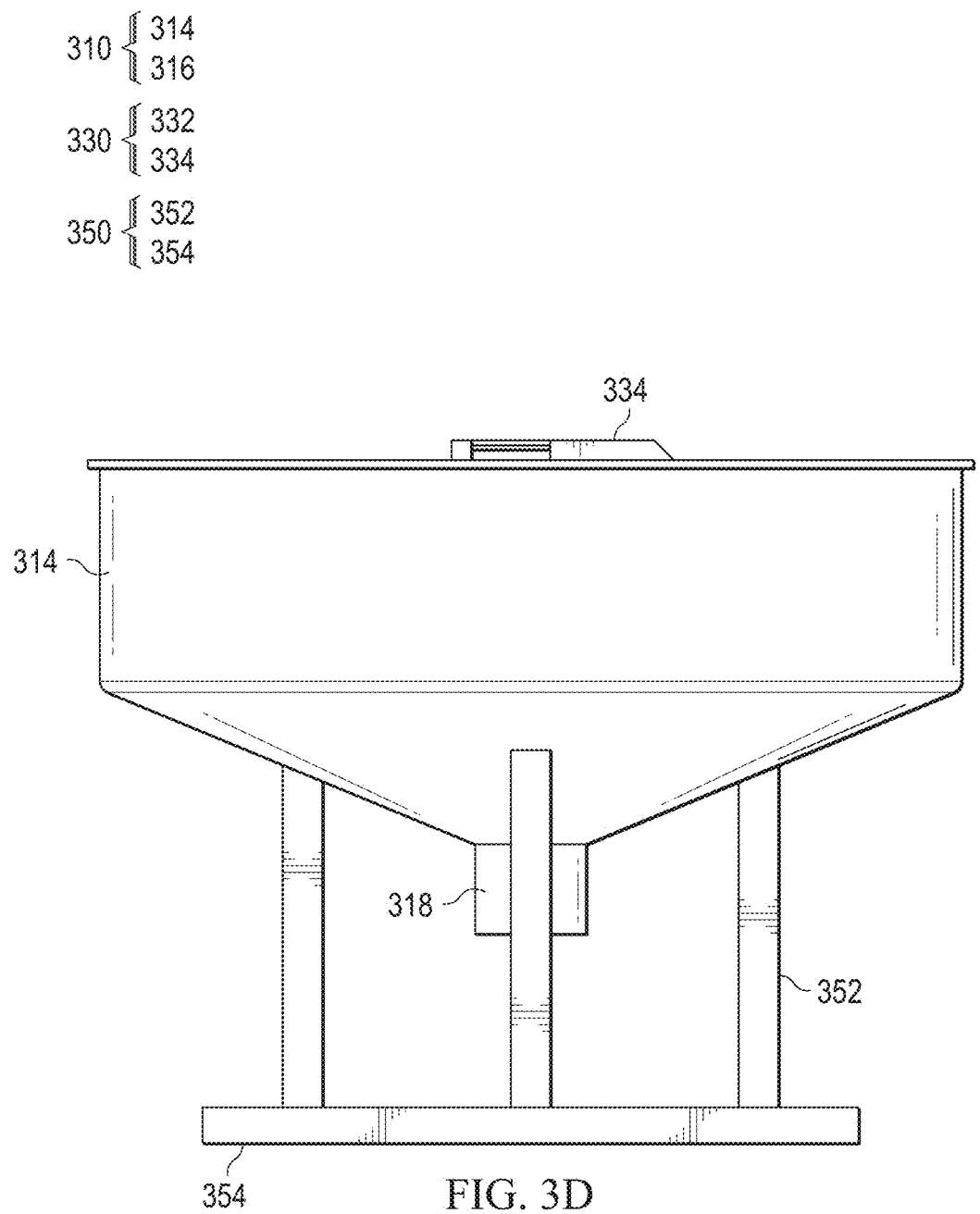

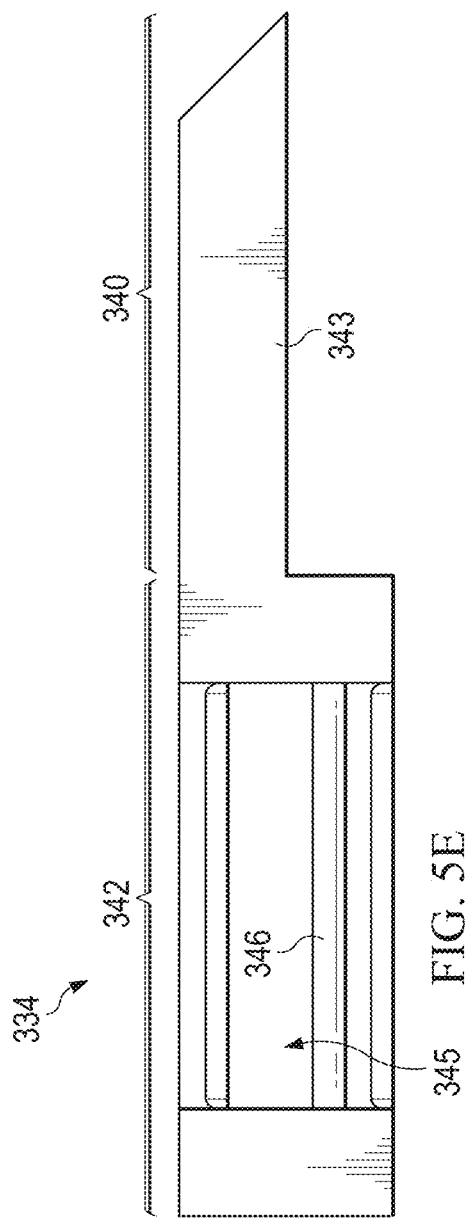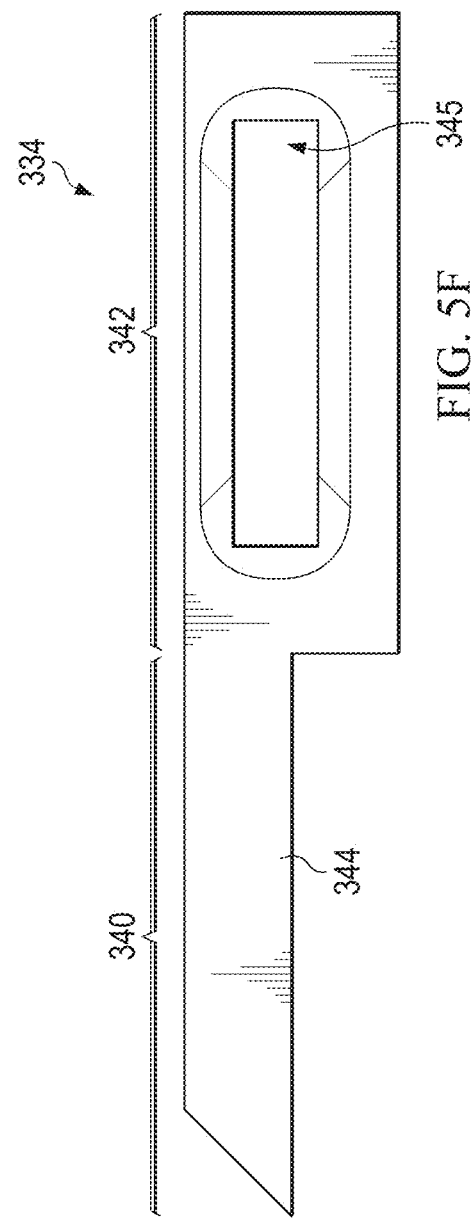

APPARATUS AND METHOD FOR UNPACKING COMPONENTS IN TAPE-AND-REEL

CROSS-REFERENCE TO RELATED APPLICATIONS

This patent application claims priority to Chinese Application No. 202322019387.2, filed on Jul. 28, 2023 and entitled "An apparatus for unpackaging components," which is hereby incorporated by reference herein as if reproduced in its entirety.

TECHNICAL FIELD

The present disclosure relates generally to the field of components in tape-and-reel, and in particular embodiments, to techniques and mechanisms for unpackaging components in tape-and-reel.

BACKGROUND

Electronic components, such as chips, integrated circuits (ICs), resistors, wafers, and so on, may be packaged in tape-and-reel for storage and transportation. As an example, electronic components may be placed into pockets of a carrier tape, and a cover tape (or upper tape) is sealed over the carrier tape to form a sealed tape or a taped reel with the electronic components encased/sealed in. The carrier tape may be in a shape of a long plastic strip. The taped reel thus includes the carrier tape having the pockets carrying the components, and the cover tape for sealing, which may be transparent. The cover tape may be pressed over edges of the carrier tape at high temperature so as to seal the carrier tape with the cover tape. The electronic components are thereby protected from contamination and damage during transportation and storage.

When the electronic components need to be taken out, the cover tape is peeled off from the carrier tape. For example, after the taped reel is produced and tested at a testing station, the electronic components in the taped reel may need to be taken out again for certain reasons (e.g., due to poor sealing of the cover tape) before being used for other purposes.

However, because of the sealing of the cover tape and the carrier tape, e.g., by pressing together at high temperature, the action of peeling off/separating the cover tape from the carrier tape (the action may also be referred to as de-taping) may generate a certain force that causes the soft carrier tape to fluctuate, which causes the electronic components in the pockets of the carrier tape to separate (e.g., fall out) from the carrier tape irregularly. This irregular separation may affect the quality of the components, e.g., components may fall into a non-designated location, resulting in contamination, surface damage, or loss of the electronic components.

In an example conventional method, the taped reel may be de-taped manually by an operator. For example, the operator may be positioned next to a collection container with a taped reel held directly above the collection container. The operator may use a tweezer to separate portions of the carrier tape and the cover tape at one end of the taped reel, and then use the tweezer to clamp the cover tape and the carrier tape near the portions separated. The operator holds the tweezer with one hand, and uses the other hand to peel off the cover tape, so that the electronic components fall into the collection container while the cover tape is being peeled off. The electronic components in the collection container may then be put in a box/container for recycling or reuse.

The de-taping operation relies on the operator's experience, and different operators may have different operating skills. Thus, it may occur that electronic components fall out of the collection container during de-taping, causing financial losses. It is also possible that electronic components may fall out when being transferred to the box from the collection container. Further, a taped reel may generally carrier a large number of electronic components, e.g., 3,000, 5,000 or 10,000 components. As a result, manual de-taping requires a large amount of labor, has low efficiency, and causes contamination of the components easily among other problems. In addition, the use of tools can easily cause damage to surfaces of the electronic components. It is thus desirable to develop mechanisms and techniques to improve de-taping efficiency of taped reels.

SUMMARY

In view of the problems discussed above, objectives of the present disclosure are to provide a device for unpackaging components carried in taped reels (components in tape-and-reel), with a structure design that effectively solve the problem of difficulty in efficiently removing components carried in taped reels/sealed tapes.

Technical advantages are generally achieved, by embodiments of this disclosure which describe an apparatus and method for unpackaging components in tape-and-reel.

In accordance with an aspect of the present disclosure, an unpackaging device for unpackaging components encased between a first tape body and a second tape body of a sealed tape is provided. The unpackaging device includes: a component collection device having a cavity for collecting the components; and a de-taping mechanism including a support based and a separation shaft connected to the support base, wherein the support base is connected to the component collection device, and the separation shaft is used to support one tape body of the first tape body and the second tape body to allow the tape body to go around the separation shaft and to be separated from the other one of the first tape body and the second tape body.

Optionally, in the unpackaging device above, the support base is provided with a through-hole for use by the sealed tape to pass through, and the separation shaft is located at one end of the through-hole.

Optionally, in the unpackaging device above, the separation shaft is rotationally connected to the support base.

Optionally, in the unpackaging device above, two ends of the separation shaft are connected to the support base through bearings, respectively.

Optionally, in the unpackaging device above, the component collection device includes a collection funnel.

Optionally, in the unpackaging device above, a top diameter of the collection funnel ranges from 380 to 420 mm.

Optionally, the unpackaging device above further includes a base, wherein the base includes a bottom plate and an upright column, a bottom end of the upright column is fixedly connected to the bottom plate, and a top end of the upright column is fixedly connected to the collection funnel.

Optionally, the unpackaging device above further includes a component box, and the component box is provided under a discharge port of the collection funnel.

Optionally, in the unpackaging device above, the separation shaft is at a height that does not exceed a top surface of the cavity.

Optionally, the unpackaging device above further includes a first driving device and/or a second driving device, the first driving device is used to pull the first tape body, and the second driving device is used to pull the second tape body.

The unpackaging device provided in embodiments of the present disclosure includes a component collection device and a de-taping mechanism. The component collection device has a cavity for collecting components; the de-taping mechanism includes a support base and a separation shaft connected to the support base, the support base is connected to the component collection device, and the separation shaft is used to support a tape body of the first tape body and the second tape body such that the tape body goes around the separation shaft and is separated from the other tape body.

In accordance with another aspect of the present disclosure, a device is provided that includes a component collection device comprising a cavity for receiving components falling out of a sealed tape being de-taped, wherein the sealed tape comprises a first tape body and a second tape body sealed to encase the components; and a de-taping device attached to the component collection device. The de-taping device comprises: a support base arranged over the cavity, and a shaft provided on a first side of the support base. The support base with the shaft is configured to enable one tape body of the first tape body and the second tape body to be extendable around the shaft to be separated from the other one of the first tape body and the second tape body.

In accordance with yet another aspect of the present disclosure, a device is provided for unpackaging components encased between a first tape body and a second tape body of a sealed tape. The device comprises: a component collection device comprising a cavity surrounded by a sidewall of the component collection device, the cavity for receiving components falling out of the sealed tape when the first tape body and the second tape body are being separated; and a de-taping structure attached to the sidewall of the component collection device. The de-taping structure comprises: a separation device connected to the sidewall of component collection device and held over the cavity; a shaft provided on a first side of the separation device; and a through-hole provided in the separation device and extending between the first side of the separation device and a second side of the separation device, wherein the first side is opposite to the second side. The separation device with the shaft and the through-hole is configured to enable one tape body of the first tape body and the second tape body to be extendable around the shaft after the sealed tape is passed through the through-hole, and to be pulled, with the separation device as a support, to separate from the other one tape body of the first tape body and the second tape body over the cavity.

In accordance with yet another aspect of the present disclosure, a device is provided for unpackaging components encased between a first tape body and a second tape body of a sealed tape. The device comprises: a component collection device having a shape of a funnel and comprising a cavity surrounded by a sidewall of the component collection device, the cavity for receiving components falling out of the sealed tape when the first tape body and the second tape body are being separated; and a de-taping structure. The de-taping structure includes: a support arm attached to the sidewall of the component collection device and extending towards inner of the component collection device; a separation device connected to the support arm and held over the cavity; a shaft mounted in a groove that is provided on a first side of the separation device, wherein the shaft is along the first side; and a through-hole provided in the separation device and extending between the first side of the separation device and a second side of the separation device, wherein the through-hole is configured for sealed tapes to pass through, and the first side is opposite to the second side. The separation device with the shaft and the through-hole is configured to enable one tape body of the first tape body and the second tape body to be extendable around the shaft after the sealed tape is passed through the through-hole, and to be pulled using the separation device as a support to separate from the other one of the first tape body and the second tape body over the cavity such that the components fall out of the sealed tape.

By using the unpackaging devices provided in embodiments of the present disclosure, the first tape body and the second tape body at the end of a sealed tape is separated, and a tape body of the first tape body and the second tape body goes around the separation shaft and is pulled. In this way, the first tape body and the second tape body are separated, and the components originally carried in the first tape body naturally fall into the cavity of the component collection device. The falling speed depends on the pulling force used to pull the first tape body and the second tape body. The embodiments significantly improve the work efficiency compared with the ordinary separation methods. At the same time, the use of the embodiment unpackaging devices avoids component fall-out due to different manual operations and contamination caused by contacting with human hands, effectively preventing component damage or contamination caused by component fall-out. In view of above, the embodiment unpackaging devices can be used to easily unpackage components from sealed tapes or components in tape-and-reel, has a high unpackaging efficiency, and is less likely to cause the components to fall out and be contaminated.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

In order to more clearly illustrate technical solutions in embodiments of the present application or technical solutions in the art, drawings to be used in descriptions of embodiments of the present application or existing techniques are briefly described in the following. Obviously, the drawings in the following descriptions are only some embodiments of the present disclosure, and those of ordinary skill in the art may also obtain other drawings based on these drawings without making creative efforts.

For a more complete understanding of the present disclosure, and the advantages thereof, reference is now made to the following descriptions taken in conjunction with the accompanying drawings, in which:

FIG. 3A-FIG. 3D are diagrams of another example unpackaging device for unpackaging components in a sealed tape according to embodiments of the present disclosure, highlighting a top perspective view, a top view, a bottom perspective view and a side view of the unpackaging device;

FIG. 5D-FIG. 5G are diagrams of a separation device in FIG. 5A-FIG. 5C according to embodiments of the present disclosure, highlighting a top view, side views and a bottom view;

DETAILED DESCRIPTION OF ILLUSTRATIVE EMBODIMENTS

Corresponding numerals and symbols in the different figures generally refer to corresponding parts unless otherwise indicated. The figures are drawn to clearly illustrate the relevant aspects of the embodiments and are not necessarily drawn to scale.

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Further, one or more features from one or more of the following described embodiments may be combined to create other embodiments not explicitly described, and features suitable for such combinations are understood within the scope of this disclosure. It is therefore intended that the appended claims encompass any such modifications or embodiments.

The technical solutions in the embodiments of the present disclosure will be clearly and completely described below with reference to the accompanying drawings in the embodiments of the present disclosure. Certainly, the described embodiments are only some, but not all, embodiments of the present disclosure. Based on the embodiments of the present disclosure, all other embodiments obtained by those of ordinary skill in the art without making creative efforts fall within the protection scope of the present disclosure.

Embodiments of the present disclosure provide a device for unpackaging components carried in sealed tapes or taped reels (e.g., components in tape-and-reel), which efficiently and reliably removes components carried in sealed tapes. Components in tape-and-reel are packaged in a sealed tape including a first tape body (e.g., a carrier tape) and a second tape body (e.g., a cover tape) sealed together. The components may be electronic components such as integrated circuits (ICs), chips, transistors, resistors, capacitors, wafers, and so on. The components may also be other parts that may be packaged in sealed tapes. The terms of "sealed tape" and "taped reel" are used interchangeably in the present disclosure. The embodiments may be used to unseal a sealed tape in other application that is applicable.

Figure 1:
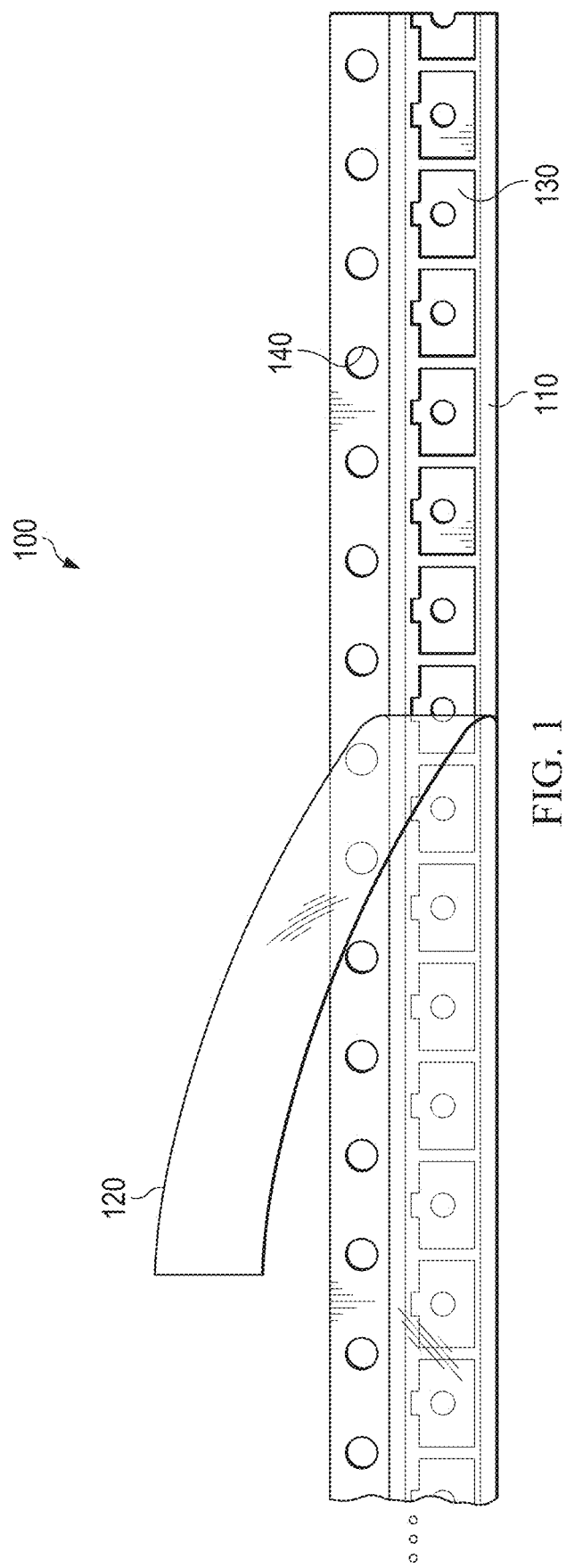
FIG. 1 schematic diagram of an example sealed tape.

FIG. 1 is a schematic diagram of an example sealed tape 100 including a carrier tape 110 and a cover tape 120, where a portion of the cover tape 120 is shown to be separated or peeled off from the carrier tape 110 for illustration purpose. The carrier tape 110 includes pockets 130 embossed in the carrier tape 110 for carrying components. The carrier tape 110 may further include guide holes (or sprocket holes) 140 along one edge of the carrier tape 100, which may be used when the components are placed in the pockets 130 e.g., using a packaging machine. The structure of the carrier tape 110, the sizes and shapes of the pockets 130, the sizes of the guide holes 140, and the arrangement of the pockets 130 and the guide holes 140 may vary depending on various applications. The cover tape 120 in this example may be transparent, but it may also be opaque. The cover tape 120 may be sealed, with heat or pressure, to the carrier tape 110 to encase the components in the pockets 130. The carrier tape 110 and the cover tape 120 for packaging the components need to comply with certain tape-and-reel packaging standards. The taped reel 100 may be de-taped (i.e., separating the carrier tape 110 and the cover tape 120, or peeling off one from the other) and components carried in the taped reel 100 may then be taken out. This may be referred to as a process of unpackaging the taped reel or specifically, unpackaging components from the taped reel. Embodiments of the present disclosure provide a simple and efficient mechanism for unpackaging a taped reel (or sealed tape) to remove/take out the components carried in the taped reel, which also reduces damage and contamination to the components.

A device for unpackaging the components carried in taped reels provided in the embodiments of the present disclosure is used to remove the components packaged/encased between a first tape body (e.g., a carrier tape) and a second tape body (e.g., a cover tape) of a taped reel. The device may be configured to, but not limited, separate the first tape body and the second tape body that are sealed together at high temperature or with pressure, so as to remove the components carried in the first tape body. The device may also be referred to as an unpackaging device or component unpackaging device. The first tape body may be a carrier tape, and the second tape body may be a cover tape.

Figure 2A:
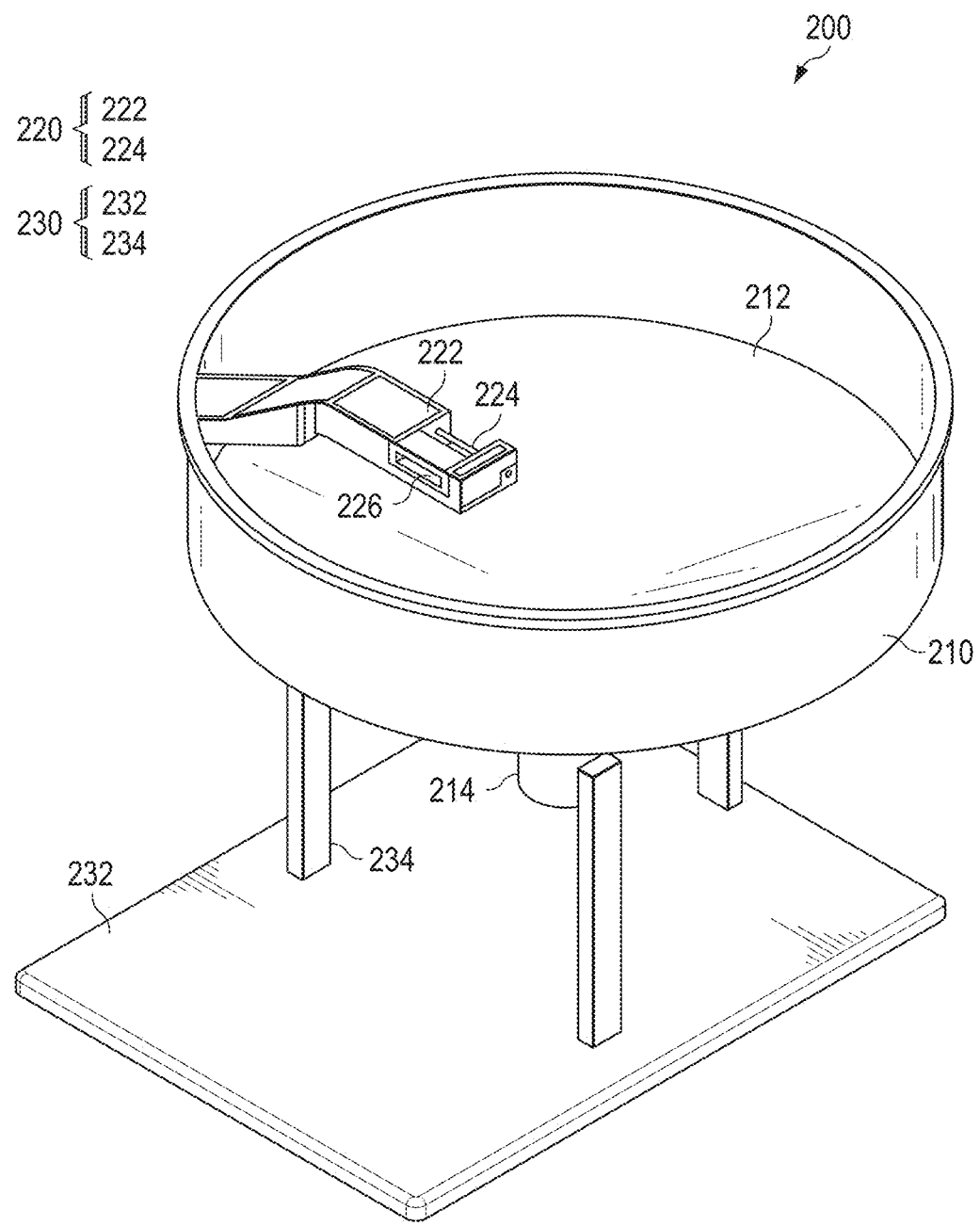
FIG. 2A is a perspective view of an example unpackaging device for unpackaging components carried in a sealed tape according to embodiments of the present disclosure.
Figure 2B:
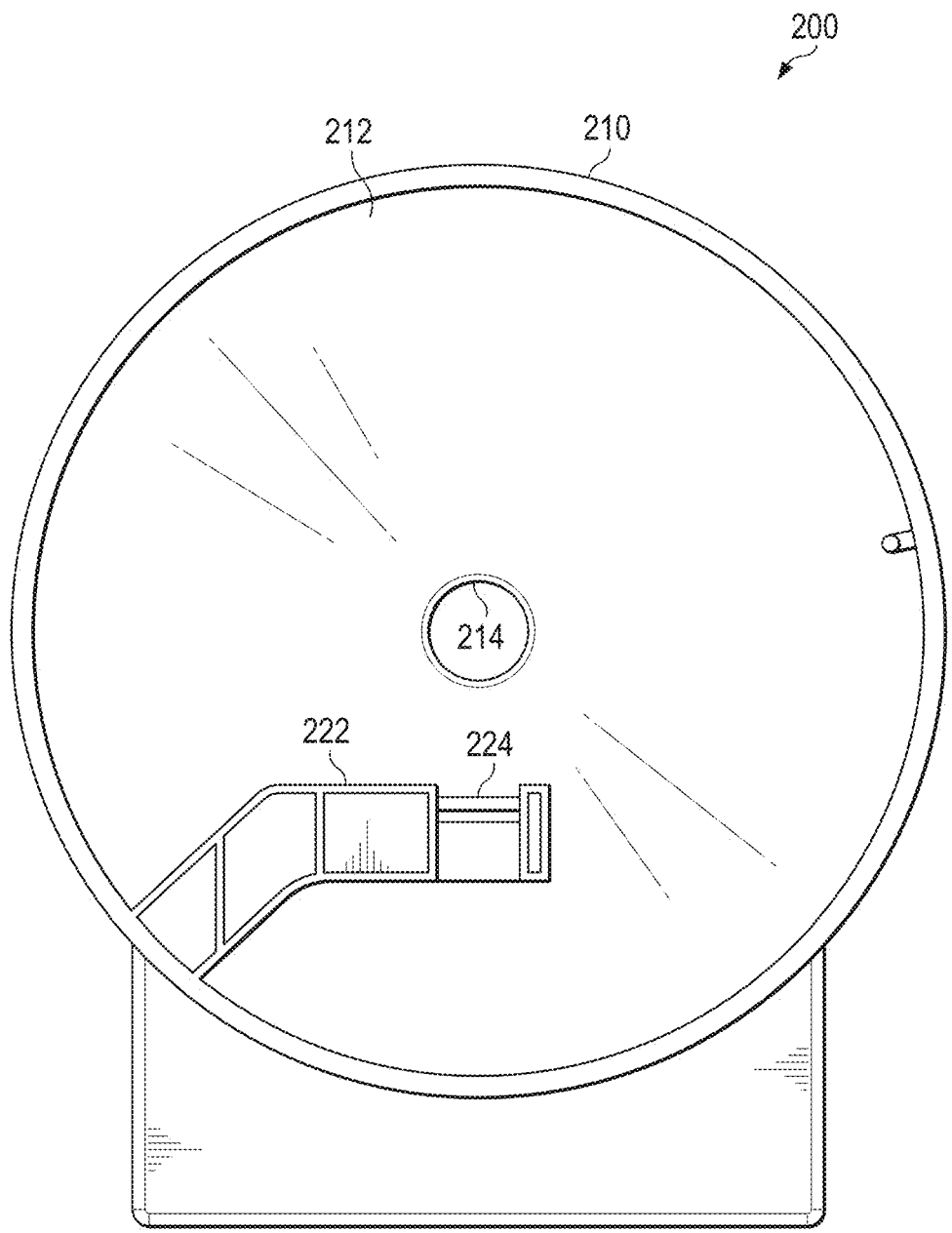
FIG. 2B is a top view of the unpackaging device in FIG. 2A.

Referring to FIG. 2A and FIG. 2B, FIG. 2A is a perspective view of an example unpackaging device 200 for unpackaging components in tape-and-reel according to embodiments of the present disclosure. FIG. 2B is a top view of the unpackaging device 200 in FIG. 2A.

As shown, in some embodiments, the unpackaging device 200 may include a component collection device 210 and a de-taping device/structure 220. The component collection device 210 may have a cavity 212 for collecting components. The shape of the component collection device 210 and the shape of the cavity 212 may be designed and configured as needed, and are not specifically limited herein. The component collection device 210 may also be referred to as a component container/collector.

The de-taping device 220 is configured to use for separating the first tape body and the second tape body of a taped reel, and the components carried in the taped reel fall into the cavity 212 of the component collection device 210. The de-taping device 220 may include a support base 222 and a separation shaft 224. The support base 222 is connected to the component collection device 210 and holds the separation shaft 224 over the cavity 212. The separation shaft 224 is connected to the support base 222, and is used to support or hold a tape body which may be the first tape body or the second tape body such that the tape body may go around the separation shaft 224 to be separated from the other tape body.

In an example operation, portions of the first tape body and the second tape body at one end of the taped reel may first be separated from each other. After the separation, one (referred to as a pulling-body of the taped reel in the following for illustration convenience) of the first tape body and the second tape body, which is closer to the separation shaft 224, may be extended, from a first direction, around the separation shaft 224, and then extended towards the first direction. The pulling body may then be pulled towards the first direction. The other one (referred to as a non-pulling-body of the taped reel in the following) of the first tape body and the second tape body does not extend around the separation shaft 224, but extends towards a second direction opposite to the first direction. By pulling the pulling-body in the first position with the use the separation shaft 224, the first tape body and the second tape body move in opposite directions, and are thus separated. As a result, the components naturally fall into the cavity 212 and are collected. Thus, by use of the separation shaft 224, the separation point where the first tape body and the second tape body are separated can be determined. The shape and size of the cavity 212 may be configured such that the components can accurately fall into the cavity 212. In one embodiment, the separation shaft 224 may be disposed in the cavity 212, to prevent the components from falling out of the cavity 212.

By use of the component unpackaging device provided in embodiments of the present disclosure, the first tape body and the second tape body may be separated at one end of the taped reel, and one (the pulling-body) of the first tape body and the second tape body is extended around the separation shaft 224 and then pulled, to cause the pulling-body to be separated from the other tape body (non-pulling-body). As a result, the components carried in the first tape body naturally fall into the cavity 212 of the component collection device 210. The speed at which the components fall into the cavity 212 depends on at least the speed at which the first tape body and the second tape body are pulled. The embodiments significantly improve the work efficiency compared with conventional unpackaging methods. At the same time, the use of the embodiment unpackaging device avoids component fall-out caused by different manual operations and contamination caused by contacting with human hands, and effectively prevents component damage or contamination caused by component fall-out. In summary, the unpackaging device provided by embodiments of the present disclosure can be used to easily unpackage components from a taped reel, which provides a high unpackaging efficiency, and reduces component fall-out and contamination.

In one embodiment, the support base 222 may be provided with a through-hole 226 for the sealed tape to pass through, and the separation shaft 224 is located at one end (e.g., first end) of the through-hole 226. The through-hole 226 is provided to restrict the position of the sealed tape. For example, the sealed tape may first be passed through the through-hole 226 (from a second end opposite to the first end of the through-hole 226), and then the first tape body and the second tape body of the sealed tape are separated by use of the separation shaft 224. By use of the separation shaft 224 and the through-hole 226 in cooperation, the sealed tape can be separated more smoothly, further improving the efficiency. It can be understood that the separation shaft 224 is provided at one end of the through-hole 226, which includes an end located inside the through-hole 226 and an end located outside the through-hole 226. When in use, the sealed tape passes through the through-hole 226, and one tape body of the first tape body and the second tape body that is closer to the separation shaft 224 extends around the separation shaft 224 in the opposite direction. That is, the one tape body is pulled in a direction opposite to the direction in which the sealed tape passes through the through-hole 226, such that the first tape body and the second tape body are separated from each other. The other one of the first tape body and the second tape body can continue to extend in the direction in which the sealed tape passes through the through-hole 226. Taking an example where the second tape body is closer to the separation shaft 224, the sealed tape passes through the through-hole 226 in a first direction, and the second tape body extends around the separation shaft 224 and thus extends in a second direction opposite to the first direction in which the sealed tape passes through the through-hole 226, while the first tape body still extends in the first direction in which the sealed tape passes through the through-hole 226, which pulls the second tape body oppositely. As a result, the first tape body and the second tape body are separated, and the components carried in the first tape body naturally drop.

Further, the through-hole 226 may be a strip-shaped hole. The sealed tape is generally in the shape of a flat strip. The through-hole 226, set as a strip-shaped hole, allows the sealed tape to pass through, and at the same time, provides support and restriction to the sealed tape to prevent it from rotating and turning over, further facilitating effective separation of the first tape body and the second tape body. The size of the through-hole 226 should meet the requirements for the sealed tape to be passed through. For example, the strip hole 226 may have a size of 7 mm×60 mm (length× width) so that it may be used normally for sealed tapes having a width of less than 40 mm. The shape of the through-hole 226 is not limited to the strip shape, and a round hole or holes in other shapes may also be used as needed.

In some embodiments, the support base 222 may not be provided with the through-hole 226. The sealed tape may be held manually, or a reel fixing bracket may be provided to support a reel wound with the sealed tape. The reel fixing bracket may include a mounting base and a support shaft. The support shaft may be provided on the mounting base, and the reel wound with the sealed tape may be placed on the support shaft and rotatable around the support shaft. By use of the reel fixing bracket in cooperation with the de-taping device 220, effective separation of the first tape body and the second tape body may also be achieved.

In one embodiment, the separation shaft 224 may be rotationally connected to the support base 222. That is, the separation shaft 224 may rotate around its own axis. When acting on the first tape body or the second tape body, there is rolling friction between the separation shaft 224 and the first tape body or the second tape body. The friction force is smaller compared with sliding friction, which makes it easier to separate the first tape body and the second tape body. Moreover, the rotatable separation shaft 224 reduces the risk of the sealed tape being jammed (tape jamming) during the de-taping process.

In one embodiment, the two ends of the separation shaft 224 may be connected to the support base 222 through bearings, respectively. By providing the bearings, the separation shaft 224 may rotate more smoothly, further reducing the risk of tape jamming during the de-taping process and component fall-out caused by tape jamming.

In one embodiment, the component collection device 210 is a collection funnel. That is, the cavity 212 of the component collection device 210 is funnel-shaped. On one hand, the wide upper part of the collection funnel can effectively collect components, and on the other hand, the components can be discharged timely along the conical surface of the collection funnel and through a discharge outlet (i.e., the narrow opening of the funnel) 214 of the collection funnel, which enables the unpackaging device 200 to operate continuously for a long time. The discharge outlet may also be referred to as discharge port, spout or exit. Thus, the usage of the unpackaging device 200 would not be affected by the cavity 212 of the component collection device 210 fully filled with components falling down from the de-taped sealed tape. Specifically, the discharge outlet 214 may be lengthened. The lengthened discharge outlet 214 can effectively prevent the components from falling out when exiting the collection funnel. The lengthened discharge outlet 214 can be used in combination with a box/container for containing the components to prevent the components from falling out. In other embodiments, the component collection device 210 may also adopt other shapes such as a box shape, a tube shape, and so on.

In one embodiment, the top diameter of the collection funnel may be in a range of 380~420 mm. During the de-taping process, the components may fall forward due to inertia. Based on the parabola of the free-fall components after the first tape body and the second tape body are separated, the distance that the components fall forward may be measured, and the size of the collection funnel may be designed based thereon. In an example, the top diameter of the collection funnel may be set within the above numerical range, specifically, in a range of 390~410 mm, and in a more specific example, the top diameter of the collection funnel may be set to be 400 mm. This size setting may better ensure that the components fall into the cavity 212.

In one embodiment, the unpackaging device 200 may further include a base 230. The base 230 includes a bottom plate 232 and (upright) column(s)/post(s) 234. The bottom end(s) of the column(s) 234 may be fixedly connected to the bottom plate 232, and the top end(s) of the column(s) 234 may be fixedly connected to the collection funnel. The bottom plate 232 may be configured such that it can be placed on a work platform such as a desktop, and provides stable and reliable support. The column(s) 234 can provide the required installation height for the collection funnel. In other embodiments, the collection funnel may also be directly fixed to a support structure such as a wall, in which case, there is no need to provide the base 230.

In one embodiment, the unpackaging device 200 may further include a component box/container located below the discharge outlet 214 of the collection funnel. During the de-taping process, the components may naturally fall into the cavity 212 of the collection funnel, fall down along the conical surface of the collection funnel, and exit the component collection device 210 through the discharge outlet 214 at the bottom. When the component box is provided in conjunction with the collection funnel, the components are discharged from the discharge outlet 214, fall directly into the component box and are stored therein. There is thus no need to further transfer the components, reducing the risk of component fall-out and damage caused by component transfer. In other embodiments, the collection funnel may also be placed at a position of a next process where the components are to be processed, that is, the components discharged from the discharge outlet 214 may directly enter the next process. In other words, the next process for the components can be started after the components exit the component collection device 210.

In one embodiment, the height of the separation shaft 224 may not exceed the height of the top surface of the cavity 212. During the de-taping process, the components may fall forward due to inertia. Therefore, by setting the height of the separation shaft 224 to not exceed the height of the top surface of the cavity 212, the components at the separation point (where the first tape body and the second tape body are separated) with any initial speed can accurately fall into the cavity 212 of the component collection device 210, e.g., the components can fall into the cavity 212 of the collection funnel as described in some embodiments above, and be collected. This ensures that the components do not fall out of the cavity 212 when the first tape body and the second tape body are separated at the separation point.

In one embodiment, the unpackaging device may further include a first driving device and/or a second driving device. The first driving device may be used to pull the first tape body, and the second driving device may be used to pull the second tape body. By providing the first driving device or the second driving device to pull the first tape body or the second tape body, the first tape body and the second tape body are separated. The above setting can realize automatic operation of separating the first tape body and the second tape body, without the need of manual pulling, and save labor. Specifically, the first driving device and the second driving device may respectively be provided at two sides of the separation shaft 224. In other embodiments, the first tape body and/or the second tape body may also be manually pulled to be separated from each other.

In one embodiment, the first driving device may include a first winding wheel and a first rotary driving device. The output end of the first rotary driving device is connected to the first winding wheel to drive the first winding wheel to rotate. The first winding wheel is used to wind the first tape body. That is, the first rotary driving device is used to drive the first winding wheel to rotate, thereby winding the first tape body around the first winding wheel, which pulls the first tape body to separate the first tape body from the second tape body. The first driving device having the above arrangement has a simple structure, provides reliable driving, and takes up small space. In other embodiments, the first driving device may also adopt other conventional driving devices capable of pulling a tape body.

In one embodiment, the second driving device may include a second winding wheel and a second rotary driving device. The output end of the second rotary driving device is connected to the second winding wheel to drive the second winding wheel to rotate. The second winding wheel is used to wind the second tape body. That is, the second rotating driving device is used to drive the second winding wheel to rotate, thereby winding the second tape body around the second winding wheel, which pulls the second tape body to separate the second tape body from the first tape body. The second driving device having the above arrangement has a simple structure, provides reliable driving, and takes up small space.

Figure 3A:
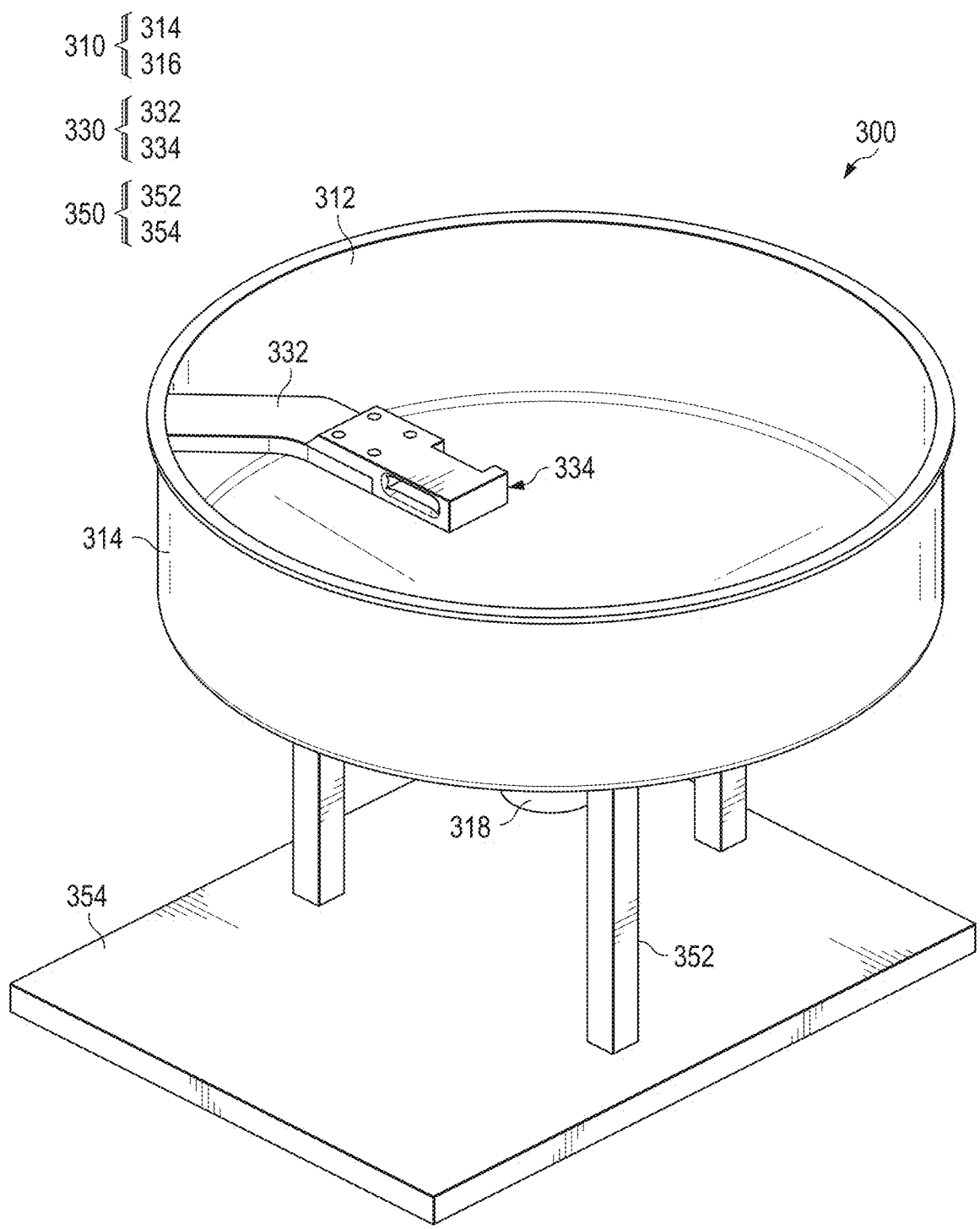
Figure 3B:
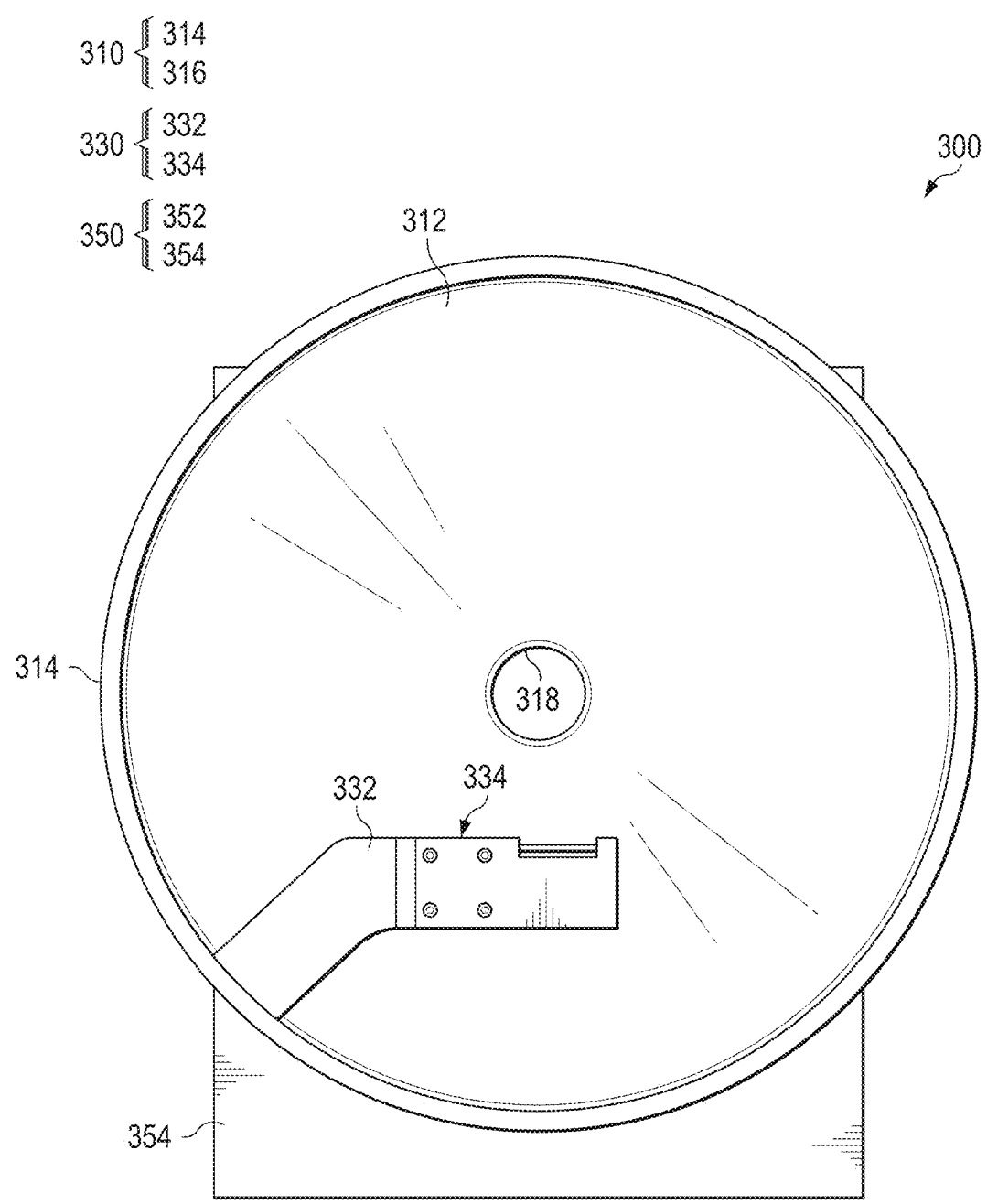
Figure 3C:
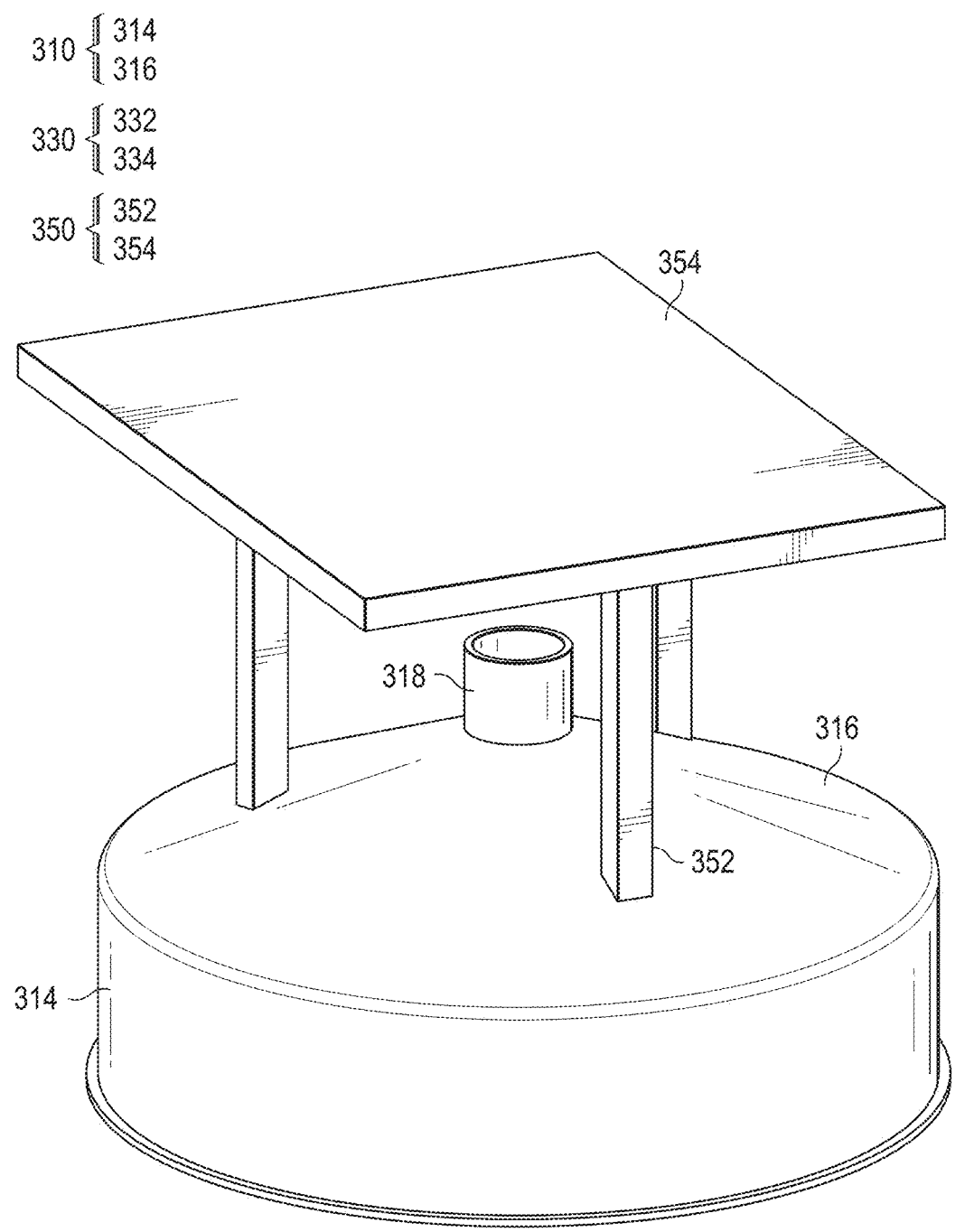

The following description will be provided with reference to FIG. 3A-FIG. 5G. FIG. 3A-FIG. 3D are diagrams of another example unpackaging device 300 for unpackaging components carried in a sealed tape according to embodiments of the present disclosure. FIG. 3A is a perspective view of the unpackaging device 300. FIG. 3B is a top view of the unpackaging device 300. FIG. 3C is a bottom perspective of the unpackaging device 300. FIG. 3D is a side view of the unpackaging device 300.

The unpackaging device 300 is similar to the unpackaging device 200 described above with respect to FIG. 2A and FIG. 2B. The unpackaging device 300 includes a component collection device 310, a de-taping device 330, and a base structure 350. The component collection device 310, the de-taping device 330, and the base structure 350 may be made of the same material or different materials. Examples of the materials may include metal, alloy, plastic, or other applicable materials.

Figure 4:
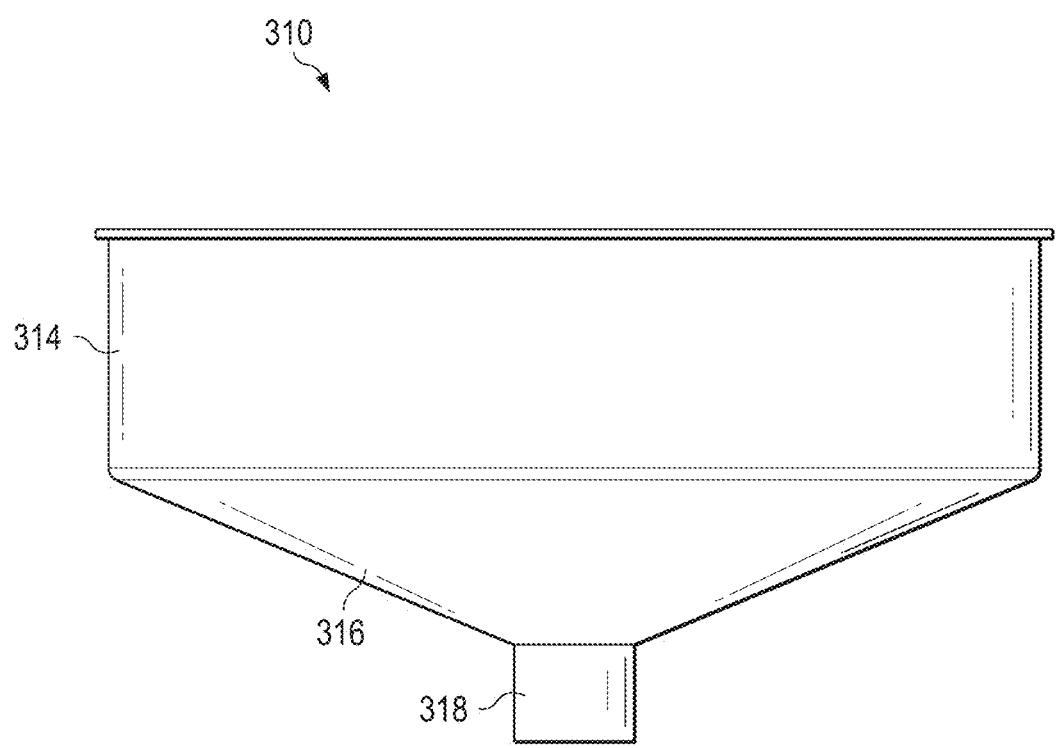
FIG. 4 is an example side view of a component collection device in FIG. 3A-FIG. 3D according to embodiments of the present disclosure.

The component collection device 310 is configured to receive components falling out of a sealed tape while the sealed tape is being de-taped. Component carrier in a sealed tape where a first tape body and a second tape body are separated may fall into the component collection device 310. The component collection device 310 may also be called a container or collector. The component collection device 310 includes a cavity 312 for receiving/collecting the fallen components. The component collection device 310 may be in a shape of a funnel. Specifically, the component collection device 310 may include an upper portion 314 that is a cylindrical tube and a lower portion 316 that is a funnel. FIG. 4 is an example side view of the component collection device 310. The upper portion 314 and the lower portion 316 may be separately made and connected forming the component collection device 310, or they may be integrally made. The lower portion (funnel) 316 includes a spout 318 through which components received by the component collection device 310 exit the component collection device 310, e.g., falling into a box arranged under the component collection device 310. The spout 318 may also be referred to as a port, outlet or exit. The cavity 312 may be viewed as being formed by the cavity (or passage) of the cylindrical tube and the cavity of the funnel. The cavity 312 has a large opening at the top of the component collection device 310 and a small opening (opening of the spout 318) at bottom of the component collection device 310.

The de-taping device 330 is configured to facilitate de-taping of the sealed tape. The de-taping device 330 includes a support arm 332 and a separation device 334. The de-taping device 330 extends generally in parallel to the top surface of the component collection device 310 (i.e., the top of the cylindrical tube). The separation device 334 is similar to the support base 222. The support arm 332 may be attached to the component collection device 310, e.g., attached to the sidewall or top rim/edge of the upper portion 314, and extends horizontally towards inner of the cavity 312. The support arm 332 is configured to extend and hold the separation device 334 such that the separation device 334 is positioned over the cavity 312. The support arm 332 may be configured (e.g., in shape, length, and so on) such that the separation device 334 is held within coverage of the cavity 312, e.g., at a specific distance to the center of the cavity 312. The support arm 332 may be movably attached/connected to the component collection device 310, such that the support arm 332 may move along the sidewall of the component collection device 310, e.g., the sidewall of the upper portion 314. This provides flexibility for adjusting the position of the separation device 332.

The separation device 334 is connected to the support arm 332, e.g., by screws as shown in the example, or in other applicable manners. The separation device 334 and the support arm 332 may generally be arranged on the same horizontal plane. In an embodiment, the separation device 334 may be configured to be rotatable on the horizontal plane around a connection point where the separation device 334 and the support arm 332 are connected, e.g., within a range such as 30 degrees or 45 degrees.

The separation device 334 is configured to facilitate de-taping of a sealed tape such that components carried in the sealed tape fall into the cavity 312 and are collected. The separation device 334 provides support point over the cavity 312 where the first tape body and the second tape body of the sealed tape are separated, and thus the corresponding components fall out of the separated portions of the sealed tape. For these components to fall into the cavity 312, the position of the separation device 334 may be specifically designed in consideration of the inertia of components falling out of the sealed tape at a certain speed, and the requirement of avoiding the components from falling out of the component collection device 310 from the de-taped sealed tape. It would be apparent for those of ordinary skill in the art that the dimension of the component collection device 310, and the shapes and dimensions of the support arm 332 and the separation device 334 as well, may be designed according to this principle.

In some embodiments, the position of the separation device 334 with respect to the center of the cavity 312 may be determined according to measurements of distances that components fall forward during de-taping of sealed tapes, when the size (e.g., top diameter) of the component collection device 310 is determined. In some embodiments, the size of the component collection device 310 and the position of the separation device 334 may be jointly determined based on the speed of the components falling out of the sealed tape. In an example, the separation device 334 may be positioned between the edge/sidewall of the component collection device 310 and the center of the component collection device 310 (e.g., the position of the spout 318) on a horizontal plane.

In some embodiments, the support arm 332 and the separation device 334 may be configured such that the position of the separation device 334 is adjustable with respect to the component collection device 310, e.g., the vertical distance from the separation device 334 to the top of the component collection device 310, the horizontal distance from the separation device 334 to the center of the component collection device 310, and so on, may be adjustable.

Figure 5A:
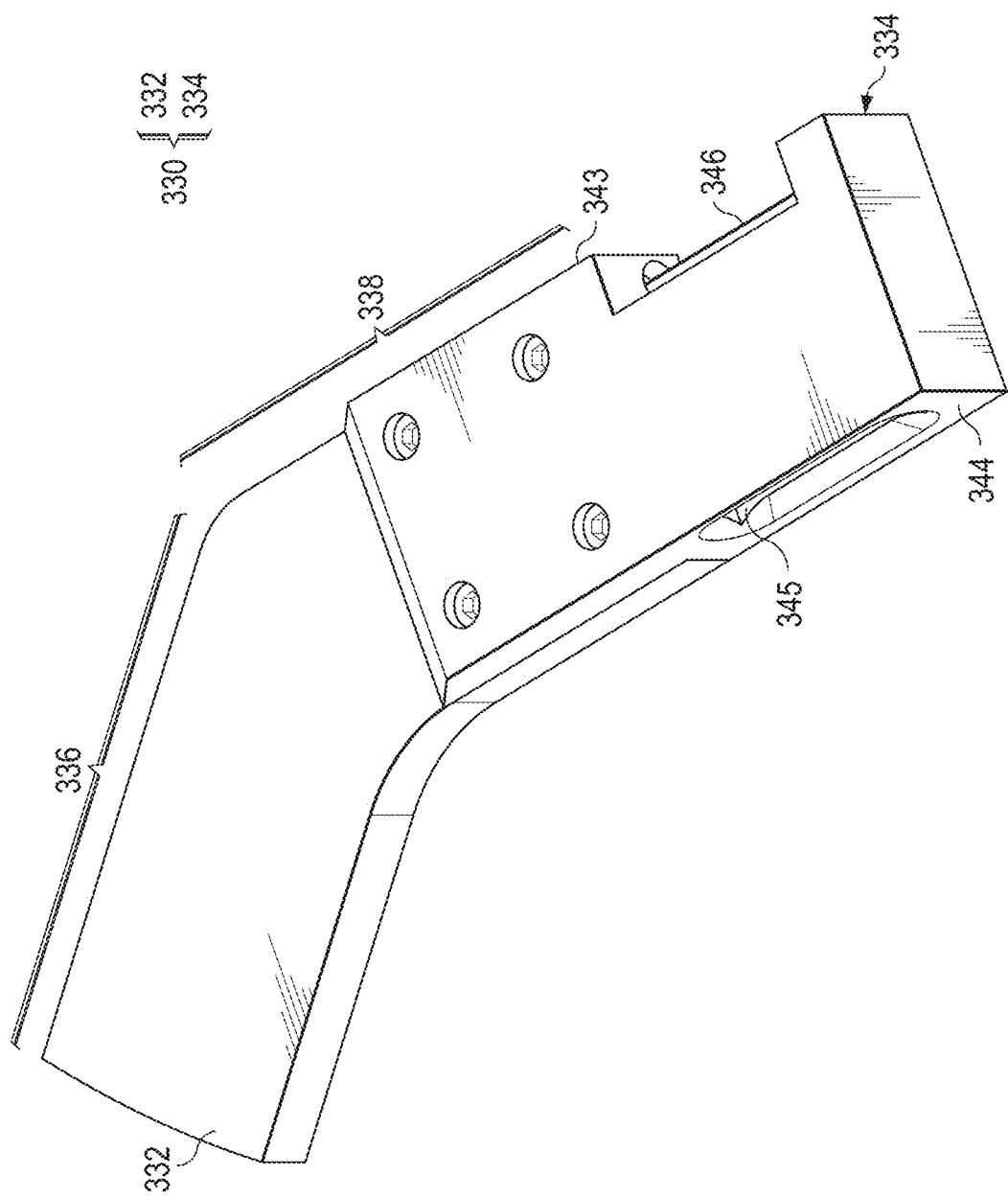
FIG. 5A-FIG. 5C are diagrams of a de-taping device in FIG. 3A according to embodiments of the present disclosure, highlighting a top view and perspective views.
Figure 5B:
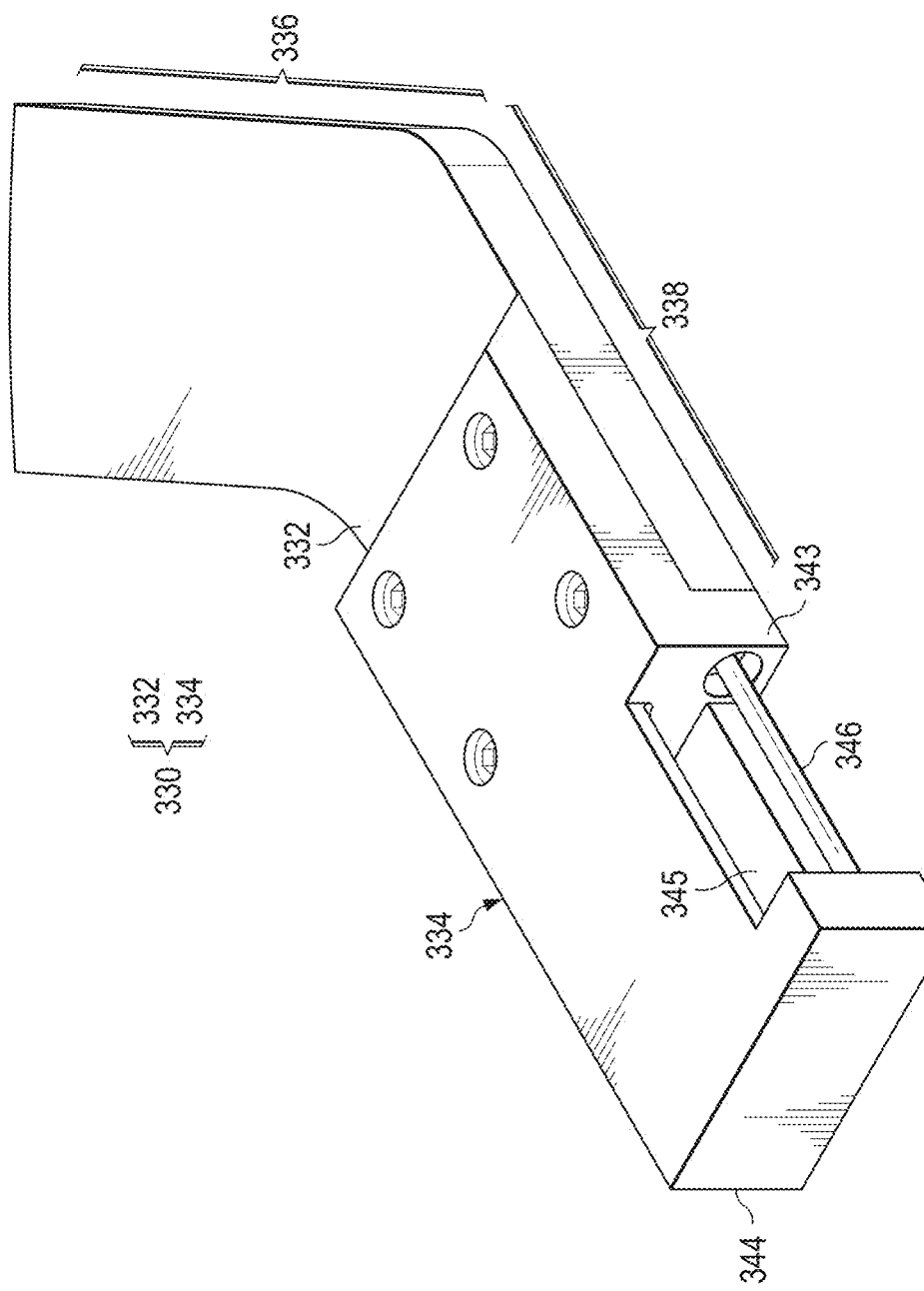
Figure 5C:
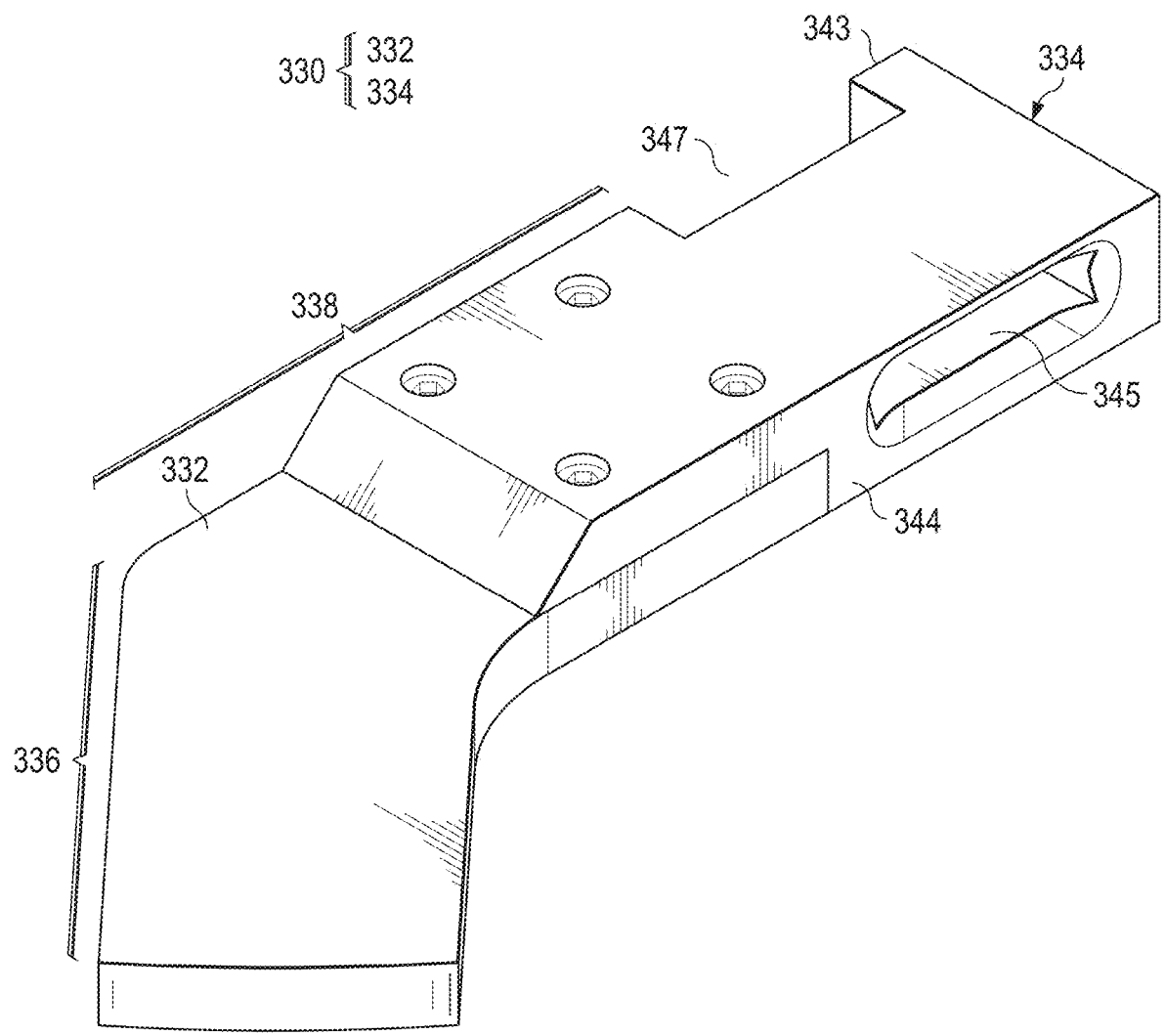
Figure 5D:
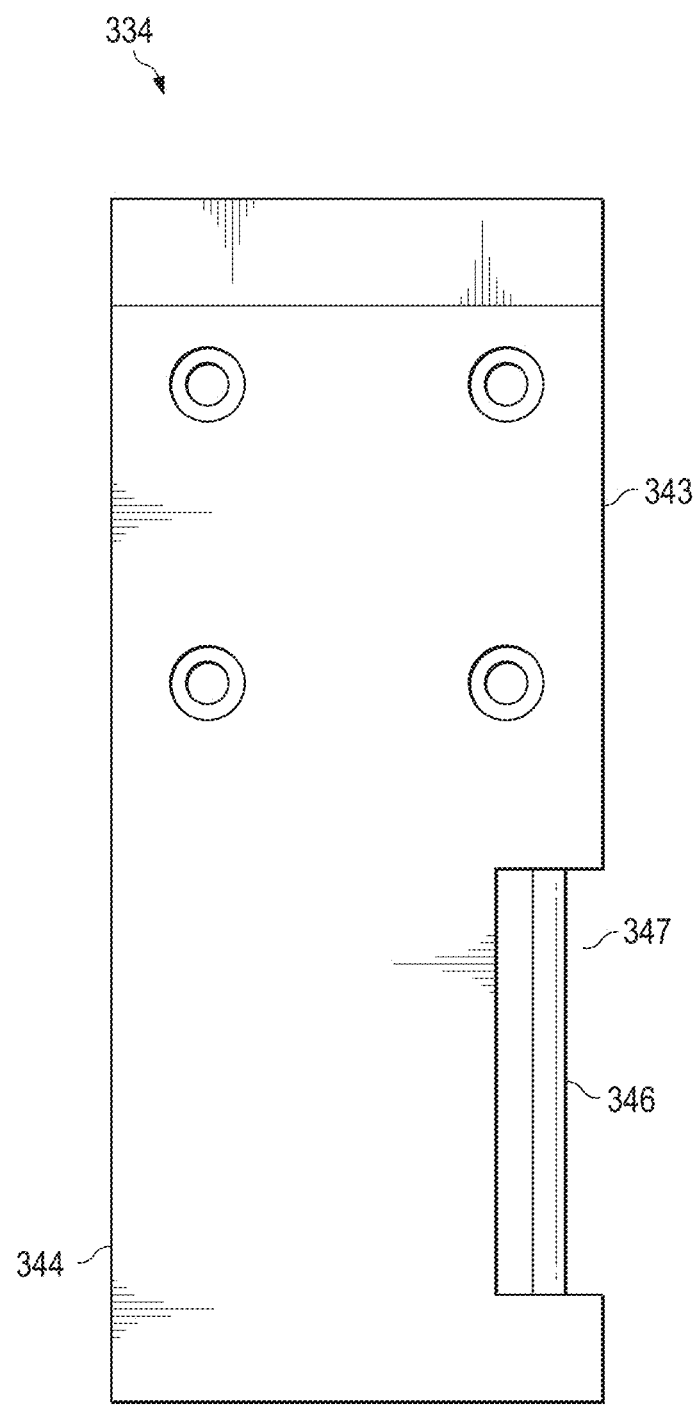
Figure 5G:
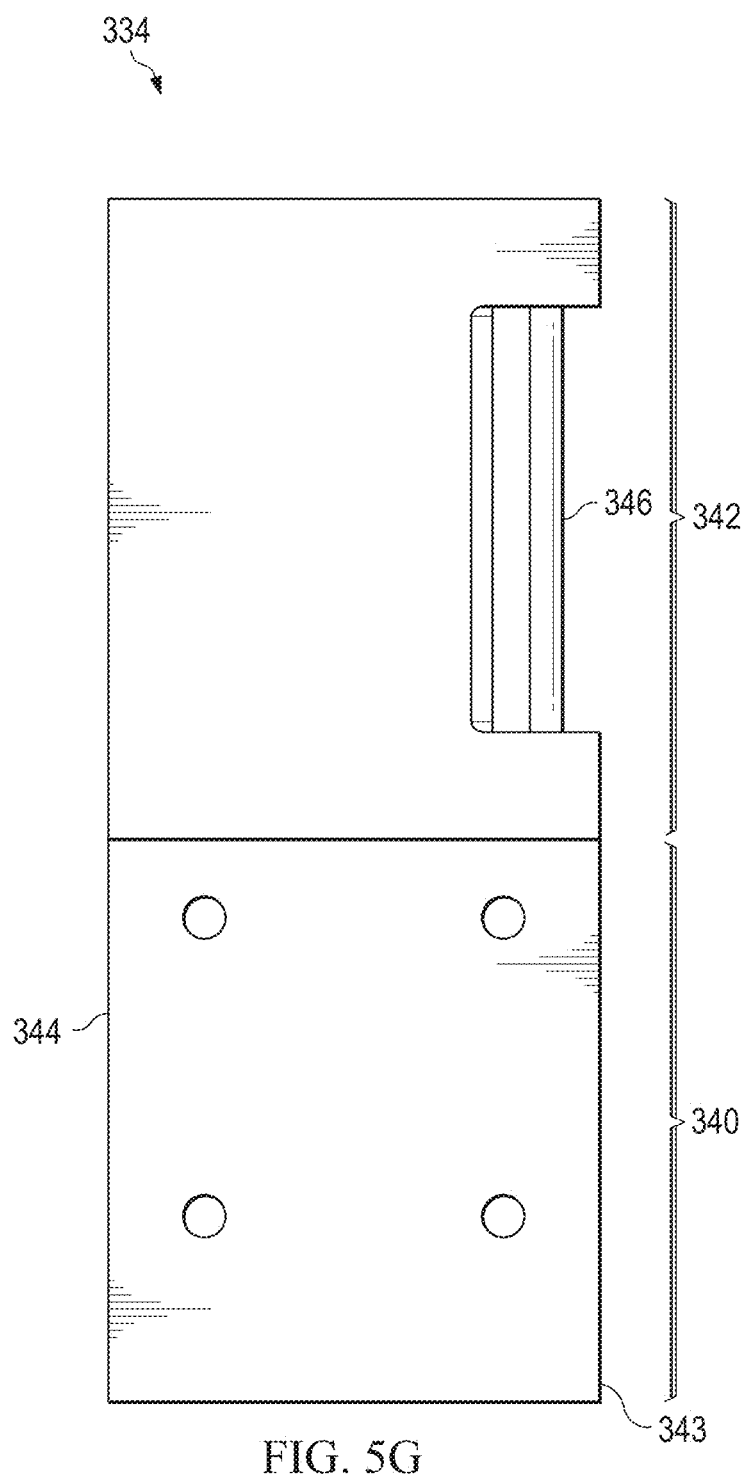

Referring to FIG. 5A-FIG. 5G, FIG. 5A-FIG. 5C are diagrams of the de-taping device 330, where the support arm 332 is connected to the separation device 334 using screws, as an example. FIG. 5A is an example top view of the de-taping device 330. FIG. 5B and FIG. 5C are example perspective views of the de-taping device 330. FIG. 5D-FIG. 5G are diagrams of the separation device 334, as an example. FIG. 5D is an example top view of the separation device 334. FIG. 5E is an example right side view of the separation device 334. FIG. 5F is an example left side view of the separation device 334. FIG. 5G is an example bottom view of the separation device 334.

The support arm 332 may include a first portion 336 attached to the component collection device 310 (at the sidewall or top rim) and a second portion 338 connected to the separation device 334. The first portion 336 and the second portion 338 may each be in a shape of strip or a rectangular prism. The first portion 336 may extend horizontally towards the center of the cavity 312, from the top rim of the component collection device 310. The first portion 336 and the second portion 338 may be connected at an angle in a range between 90 degrees and 180 degrees on the horizontal plane. The angle is configured such that the separation device 334 may be held at a suitable position with respect to the cavity 312.

The separation device 334 may be generally in a rectangular shape when being viewed from its top or bottom. The separation device 334 may be connected to part of the second portion 338. As an example, the separation device 334 may include a first portion 340 and a second portion 342. The first portion 340 and the second portion 342 may each be in a strip shape. The first portion 340 of the separation device 334 may be configured for connection with the part of the second portion 338 of the support arm 332. As an example, the first portion 340 may be placed over the second portion 338 of the support arm 332, overlapping with the part of the second portion 338 of the support arm 332. The overlapping portions of the support arm 332 and the separation device 334 may then be screwed together, or fastened together in other applicable manners. In an example, the first portion 340 and the second portion 338 may extend in the same direction lengthwise and fastened. In another example, the overlapping portions may be rotationally fastened such that the separation device 334 may rotate within a range, around the support arm 332. This provides flexibility for adjusting the position of the separation device 334 over the cavity 312.

The separation device 334 has a right side 343 and a left side 344. The separation device 334 may include a through-hole 345 provided in the second portion 342 of the separation device 334, where the through-hole 345 extends through the second portion 342 of the separation device 334 in the direction of the right side 343 and the left side 344. That is, the through-hole 345 extends from the right side 343 to the left side 344 or vice versa. The through-hole 345 has two openings respectively on the right side 343 and the left side 344. The through-hole 345 may be configured such that a sealed tape can be inserted and passed through.

The separation device 334 may further include a separation shaft 346 mounted in the second portion 342 of the separation device 334 along the right side 343 of the separation device 334. As an example, a groove 347 may be provided on the right side 343 of the separation device 334, and the separation shaft 346 may be located in the groove 347 and mounted to the second portion 342 of the separation device 334. The separation shaft 346 may be in parallel to the right side 343 lengthwise. The separation shaft 346 may be similar to the separation shaft 224, and mounted through bearings, as an example. The separation device 334 provides a support point/position where one tape body of the first tape body and the second tape body may be pulled/extended around the separation shaft 346, and then the first tape body and/or the second tape body may be pulled. The separation device 334 also provides a separation point/position where the first tape body and/or the second tape body are separated. In an embodiment, the separation shaft 346 may be at a position that is lower than the top rim or top edge of the cavity 312, which avoids components from falling out of the cavity 312.

Referring back to FIG. 3A-FIG. 3D, the base structure 350 is similar to the base 230 in FIG. 2A. The base structure 350 includes three columns/posts 352 and a bottom plate 354. The three columns/posts 352 are connected between the component collection device 310 and the bottom plate 354. The bottom plate 354 may be configured such that it can be placed on a surface, and provides stable and reliable support to the unpackaging device 300. The bottom plate 354 may be optional. The base structure 350 may also be optional. The three columns/posts 352 may have a height that allows a certain distance between the spout 318 and the bottom plate 354 or a surface where the unpackaging device 300 is located. Thus, a box may be placed under the spout 318 and able to collect components falling out through the spout 318.

Figure 6:
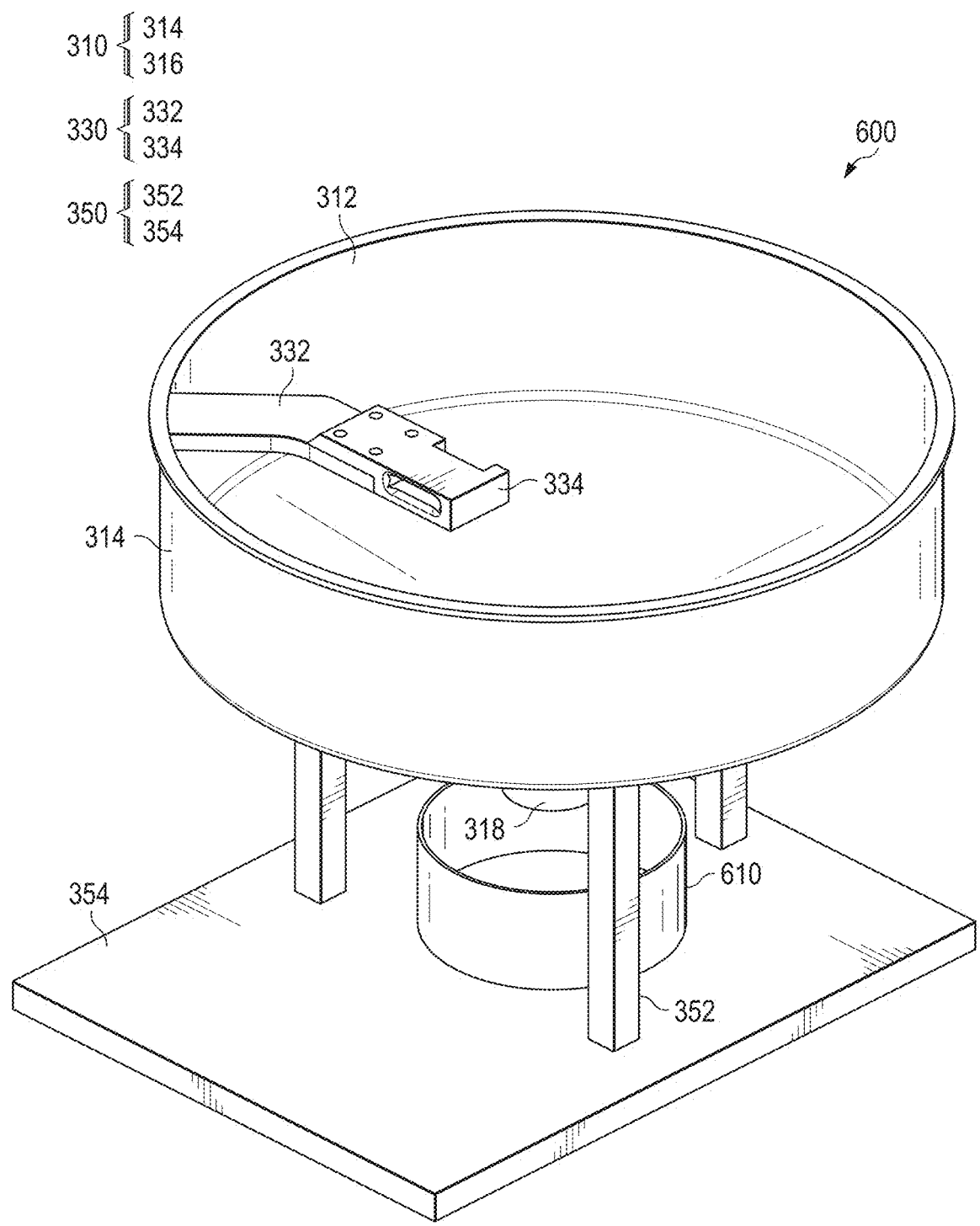
FIG. 6 is a diagram of another unpackaging device according to embodiments of the present disclosure.

FIG. 6 is a diagram of another unpackaging device 600 according to embodiments of the present disclosure. The unpackaging device 600 has a similar structure to the unpackaging device 300, however, FIG. 6 shows a box/container 610 placed on the bottom plate under the spout of the component collection device. Components falling out of the component collection device through the spout fall into the box 610 and are collected. The collected components may then be transferred to other locations for further processing or storage. Those of ordinary skill in the art would understand that mechanisms may be configured to automatically place the box/container 610 on the bottom plate and automatically remove the box/container 610, e.g., by use of a robotic arm.

Figure 7:
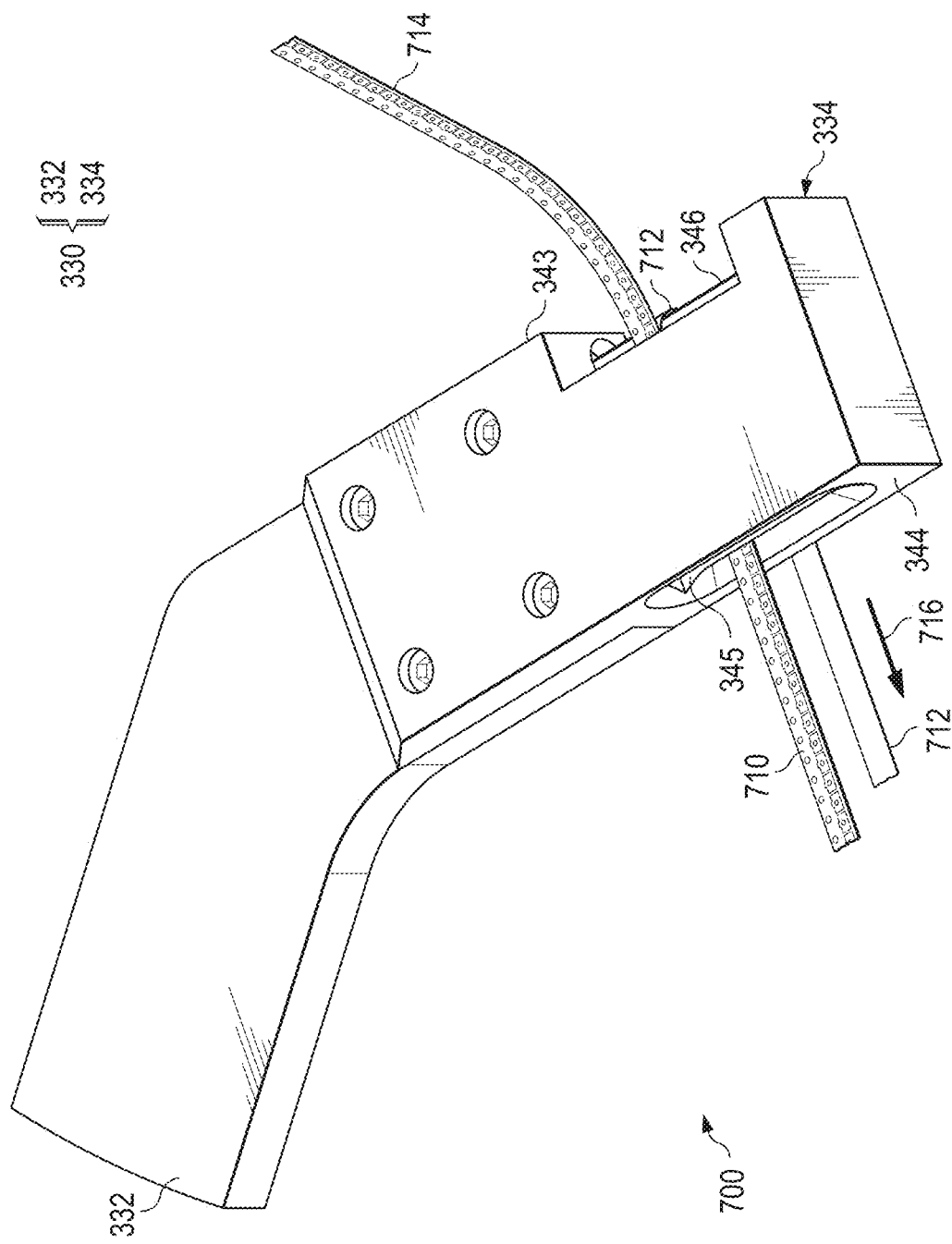
FIG. 7 is a diagram showing an example de-taping operation according to embodiments of the present disclosure.

FIG. 7 is a diagram 700 showing an example de-taping operation according to embodiments of the present disclosure. FIG. 7 shows the de-taping device 330 including the support arm 332 and the separation device 334, with a sealed tape 710 passing through the through-hole 345 of the separation device 334. An end of the sealed tape 710 may be inserted, from the left side 344 of the separation device 334, into the through-hole 345 with its cover tape 712 facing downward. The sealed tape 710 passes through the through-hole 345 and comes out of the through-hole 345 from the right side 343 of the separation device 334 above the separation shaft 346. The cover tape 712 at the end of the sealed tape 710 may be separated from the carrier tape 714 of the sealed tape 710 before the sealed tape 710 is inserted into the through-hole 345 or after the sealed tape 710 gets out of the through-hole 345 from the right side 343. The portion of the cover tape 712 that has been separated from the carrier tape 714 may then be pulled down and around the separation shaft 346, continue to be pulled around the second portion 342 of the separation device 334, and pulled towards the left side 344 of the separation device 334, as shown by the arrow 716. As the cover tape 712 continues to be pulled towards the left side 344 of the separation device 334 with the separation device 334 as a support, the carrier tape 714 extends to the right side 343 of the separation device 334, and the cover tape 712 and the carrier tape 714 are gradually separated. When the cover tape 712 is pulled at a certain speed, the sealed tape 710 is de-taped and the components carried in the carrier tape 714 fall out of the carrier tape 714 and down into the component collection device 310. The sealed tape 710 may be wound around a reel, e.g., a tape reel. The reel may be any reel used in tape-and-reel technology, or other applicable reels.

As described above, two driving devices may be provided to pull the cover tape 712 and the carrier tape 714, respectively, in opposite directions. As an example, the portion of the cover tape 712 that has been separated from the carrier tape 714 and extended around the separation shaft 346 may be connected to a first driving device, and a portion of the carrier tape 714 that has been separated from the portion of the cover tape 712 may be connected to a second driving device. The first driving device and the second driving device may be configured to automatically pull the cover tape 712 and the carrier tape 714 at a certain speed and in opposite directions, such that the cover tape 712 is peeled off from the carrier tape 714, and the components fall out of the carrier tape 714.

In some embodiments, a box/container, e.g., the box 610, may be placed under a component collection device of an unpackaging device, e.g., the component collection device 310 (under the spout 318), for collecting components received by the component collection device from a detaped sealed tape. As components are falling down from the component collection device, they may hit components that have already been collected in the box and cause component damage. In some embodiments, mechanisms may be provided in the box to spread out the components landing in the box to avoid such damage. FIG. 8-FIG. 12 provide some embodiment mechanisms that may be used to mitigate or avoid such component damage. While embodiments in FIG. 8-FIG. 11 use boxes having shapes as shown, other shapes for the boxes may also be used, and further, other applicable mechanisms in addition to what are described may also be used, without departing from the spirit and principle of the present disclosure.

Figure 8A:
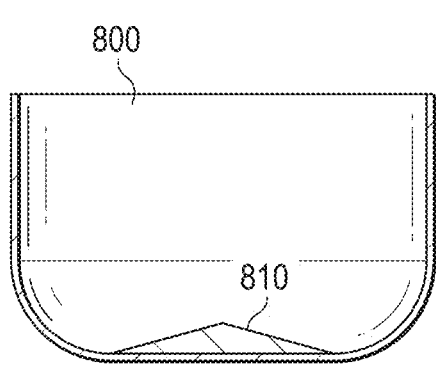
FIG. 8A and FIG. 8B are diagrams of an example box for collecting components according to embodiments of the present disclosure.
Figure 8B:
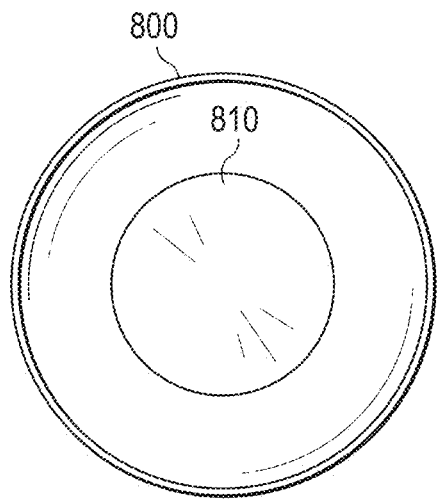

FIG. 8A and FIG. 8B are diagrams of an example component box/container 800, in a cross-sectional view and a top view, according to embodiments of the present disclosure. The box 800 includes a cone-shaped plate 810 placed (e.g., fixedly or removably) on the bottom of the box 800 in the middle of the bottom. The titled surface of the cone-shaped plate 810 may have an angle with respect to the bottom of the box 800 such that at least some components falling into the box 800 can fall downwards along the slope of the titled surface and land on the bottom of the box 800 around the cone-shaped plate 810 or land on the lower portion of the surface of the cone-shaped plate 810. Thus, components falling into the box 800 from the component collection device are moved to a place where they are not hit or hit less by falling components, which reduces the component damage.

Figure 9A:
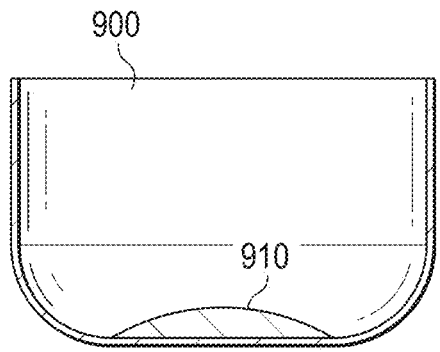
FIG. 9A and FIG. 9B are diagrams of another example box for collecting components according to embodiments of the present disclosure.
Figure 9B:
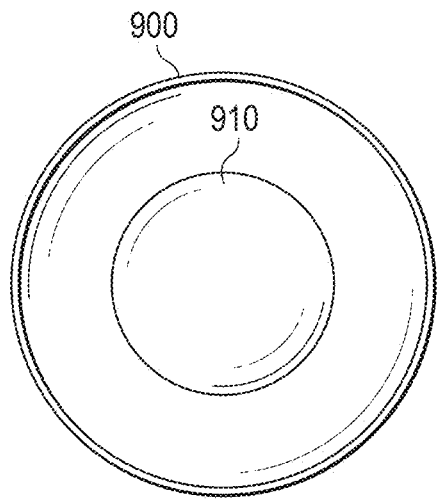

FIG. 9A and FIG. 9B are diagrams of another example component box/container 900, in a cross-sectional view and a top view, according to embodiments of the present disclosure. The box 900 includes a plate 910 placed (e.g., fixedly or removably) on the bottom of the box 900 in the middle of the bottom. The plate 910 has an arched or rounded top surface. The top surface of the plate 910 may be configured such that at least some components falling into the box 900 can fall downwards along the top surface of the plate 910 and land on the bottom of the box 900 around the plate 910.

Figure 10A:
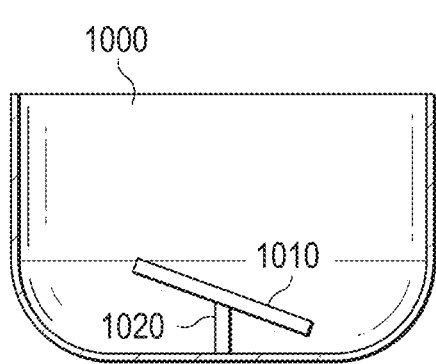
FIG. 10A and FIG. 10B are diagrams of another example box for collecting components according to embodiments of the present disclosure.
Figure 10B:
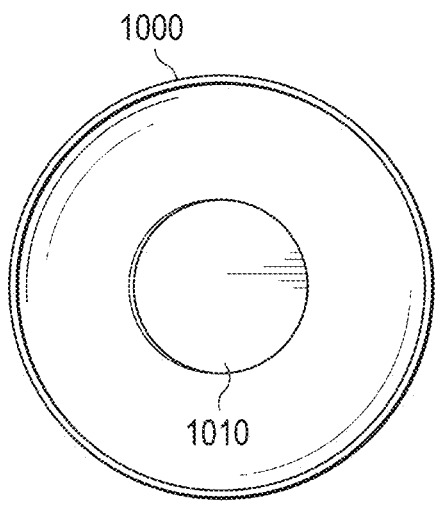

FIG. 10A and FIG. 10B are diagrams of another example component box/container 1000, in a cross-sectional view and a top view, according to embodiments of the present disclosure. The box 1000 includes a tilted plate 1010 placed on the bottom of the box 1000 in the middle of the bottom. The titled plate may have a flat surface. The titled plate may have an angle with respect to the bottom of the box 1000 such that components falling into the box 1000 can fall downwards along the top surface of the titled plate 1010 and land on the bottom of the box 1000. In an embodiment, the titled plate 1010 may be mounted on a post 1020 which may be arranged in the middle of the bottom of the box 1000, and the titled plate 1010 is not in touch with the bottom of the box 1000. The height of the post 1020 may be configured to avoid damaging the components falling from the plate 1010 to the bottom of the box 1000. In some embodiments, the titled plate 1010 may be spinnable around the post 1020, such that components falling into the box 1000 are further spread out in the box 1000.

Figure 11A:
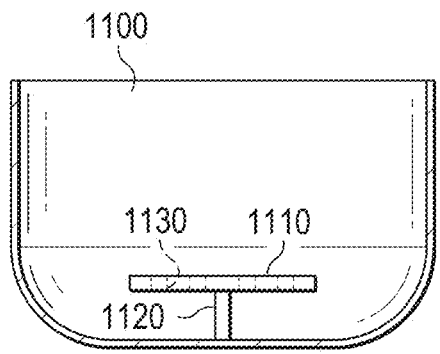
FIG. 11A and FIG. 11B are diagrams of another example box for collecting components according to embodiments of the present disclosure.
Figure 11B:
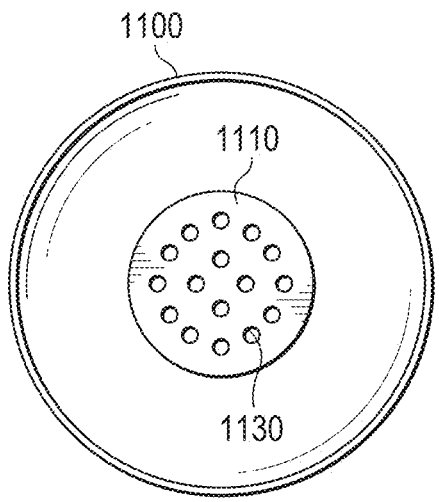

FIG. 11A and FIG. 11B are diagrams of another example component box/container 1100, in a cross-sectional view and a top view, according to embodiments of the present disclosure. The box 1100 includes a plate 1110 placed on the bottom of the box 1100 in the middle of the bottom. The plate 1110 may have a flat surface and may be placed generally in parallel to the bottom of the box 1100. The plate 1110 may be mounted on a post 1120 which may be arranged in the middle of the bottom of the box 1100, and the plate 1110 is not in touch with the bottom of the box 1100. The plate 1110 may include a plurality of through-holes 1130 through which at least components falling into the box 1100 fall onto the bottom of the box 1100. The plurality of through-holes 1130 may be randomly distributed on the plate 1110 or in a specific pattern. The plate 1110 may also be configured to be spinnable with the post 1120 as an spinning axis, which further spread out the components in the box 1100.

Figure 12:
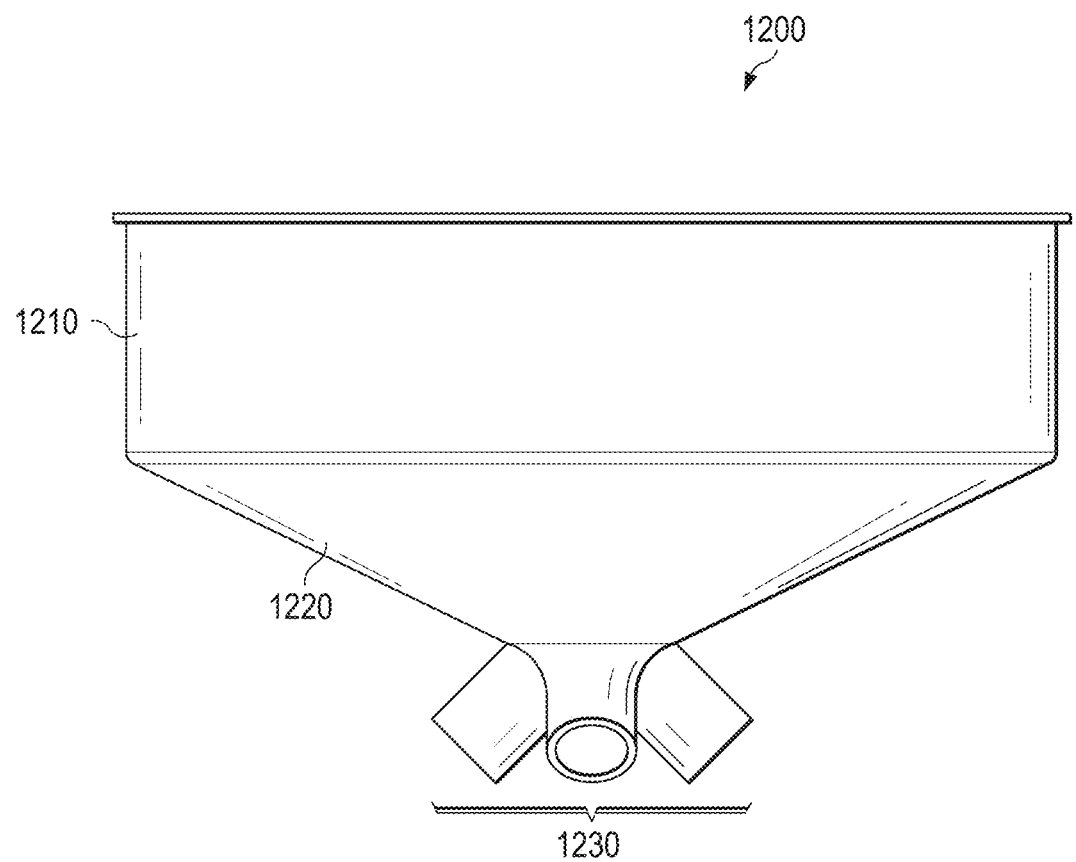
FIG. 12 is a diagram of an example component collection device according to embodiments of the present disclosure.

FIG. 12 is a diagram of an example component collection device 1200, in a cross-sectional view, according to embodiments of the present disclosure. The component collection device 1200 is similar to the component collection device 310, and includes a cylindrical tube 1210 connected to a funnel 1220. Different from the component collection device 310, the component collection device 1200 includes multiple spouts 1230 at the bottom of the funnel 1120, through which components received by the component collection device 1200 fall out of the component collection device 310, e.g., falling into a box. The multiple spouts 1230 all the components to fall into a larger area of the box, and thus spread out the falling components landed in the box, which reduces component damage caused by the falling components hitting components already in the box. The funnel 1220 may be provided with two or more spouts. The multiple spouts may be distributed evenly at the bottom of the funnel 1220.

In the embodiments of FIG. 8-FIG. 11, the plates (or the top surfaces of the plates) may be positioned at a height that is half or less than half of the heights of the boxes, which allows the boxes to contain a certain number of components. The sizes and positions of the plates may vary based on different applications or needs.

Two or more embodiments described with respect to FIG. 8-FIG. 12 may be combined to provide other embodiments, and other mechanisms may also be added. In an example, an unpackaging device may include the component collection device 1200 and a box 800, 900, 1000, or 1100. In another example, the plate 810 or the plate 910 may also have through-holes as described in FIG. 11A and FIG. 11B. In some embodiments, a fan may be provided in a box to blow the components falling into the box, which further spreads out the components landed in the box.

While the above embodiments are described with a component collection device having a shape of a funnel as examples, other shapes may also be applicable for the component collection device. Generally, the component collection device is configured such that the cavity of the component collection device may have a first opening at the top of the component collection device and a second opening at the bottom of the component collection device. The second opening may be smaller than the first opening. Further, the component collection device may have sidewall (s) that is/are tilted such that components falling into the component collection device can fall down along the titled sidewall(s) and exit the component collection device through the second opening.

Figure 13:
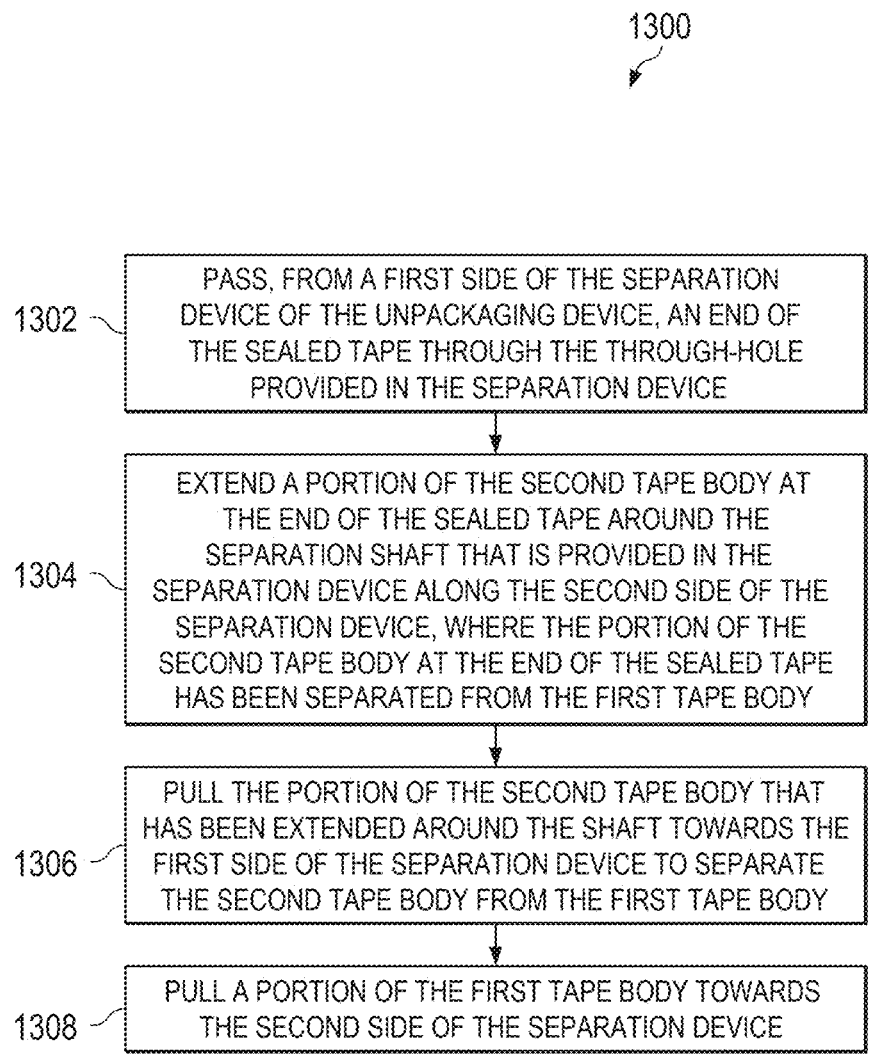
FIG. 13 is a flowchart of an example method for unpackaging components carried in a sealed tape according to embodiments of the present disclosure.

FIG. 13 is a flowchart of an example method 1300 for unpackaging components carried in a sealed tape according to embodiments of the present disclosure. The method 1300 may be implemented using the unpackaging device 200 or 300, which may include one or more embodiment features as described with respect to FIG. 8-FIG. 12. The sealed tape includes a first tape body and a second tape body sealed to encase components in between. The method 1300 may include passing, from a first side of the separation device of the unpackaging device, an end of the sealed tape through the through-hole provided in the separation device (step 1302). The sealed tape extends out of the through-hole from a second side of the separation device. The method 1300 may further include extending a portion of the second tape body at the end of the sealed tape around the separation shaft that is provided in the separation device along the second side of the separation device, where the portion of the second tape body at the end of the sealed tape has been separated from the first tape body (step 1304). The second side is opposite to the first side of the separation device. The method 1300 may also include pulling the portion of the second tape body that has been extended around the shaft towards the first side of the separation device to separate the second tape body from the first tape body (step 1306). The method 1300 may further include pulling a portion of the first tape body towards the second side of the separation device (step 1308). Steps 1306 and 1308 may be performed simultaneously. Step 1308 may be optional. The portion of the second tape body at the end of the sealed tape may be separated from the first tape body before or after the sealed tape is passed through the through-hole. The method 1300 may also include collecting components falling out of the sealed tape while the first tape body and the second tape body are separated.

Embodiment of the present disclosure are described in a progressive manner. Each embodiment is described with focus on its differences from other embodiments. The same and similar parts between the various embodiments can be referred to each other.

The above description of embodiments of the present disclosure enables people in the art to implement or use the present invention. Various modifications to these embodiments will be readily apparent to those ordinarily skilled in the art, and the general principles provided herein may be practiced in other embodiments without departing from the spirit or scope of the present disclosure. Therefore, the present disclosure is not intended to be limited to the embodiments provided herein, but is to be accorded the widest scope consistent with the principles and novel features disclosed herein.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. A device comprising:
   a component collection device comprising a cavity for receiving components falling out of a sealed tape being de-taped, wherein the sealed tape carries the components encased between a first tape body and a second tape body of the sealed tape; and
   a de-taping device attached to the component collection device, wherein the de-taping device comprises:
      a support base arranged over the cavity, wherein the support base is fixed to a sidewall of the component collection device, and
      a shaft provided on a first side of the support base, wherein the support base with the shaft is configured to enable one tape body of the first tape body and the second tape body to be extendable around the shaft to be separated from the other one of the first tape body and the second tape body.

2. The device of claim 1, wherein the support base is provided with a through-hole extending from the first side to a second side of the support base, the through-hole is configured for sealed tapes to pass through, and the second side is opposite to the first side.

3. The device of claim 1, wherein the shaft is rotationally connected to the support base.

4. The device of claim 1, wherein the shaft is provided in a groove at the first side of the support base.

5. The device of claim 1, wherein the component collection device has a shape of a funnel.

6. The device of claim 1, wherein a top diameter of the cavity is in a range from 380 mm to 420 mm.

7. The device of claim 1, further comprising a base, wherein the base includes a bottom plate and at least one column, and the at least one column is fixedly connected between the bottom plate and a bottom of the component collection device.

8. The device of claim 1, further comprising:
   an outlet at a bottom of the component collection device, and
   a box arranged under the outlet of the component collection device for collecting components falling out of the component collection device through the outlet.

9. The device of claim 1, wherein the shaft is at a position that is not higher than a top of the cavity.

10. The device of claim 1, wherein the support base is movably attached to the sidewall of the component collection device.

11. The device of claim 1, wherein the support base extends from the sidewall towards a center of the cavity.

12. A device for unpackaging components encased between a first tape body and a second tape body of a sealed tape, comprising:
   a component collection device comprising a cavity surrounded by a sidewall of the component collection device, the cavity for receiving components falling out of the sealed tape when the first tape body and the second tape body are being separated; and a de-taping structure attached to the sidewall of the component collection device, wherein the de-taping structure comprises:
  support base connected to the sidewall of component collection device and held over the cavity;
  a shaft provided on a first side of the support base; and
  a through-hole provided in the support base and extending between the first side of the support base and a second side of the support base, wherein the first side is opposite to the second side; and
  wherein the support base with the shaft and the through-hole is configured to enable one tape body of the first tape body and the second tape body to be extendable around the shaft after the sealed tape is passed through the through-hole, and to be pulled, with the support base as a support, to separate from the other one tape body of the first tape body and the second tape body over the cavity.

13. The device of claim 12, wherein the shaft is rotationally attached to the support base along the first side of the support base.

14. The device of claim 12, wherein the support base includes a groove at the first side and the shaft is located in the groove.

15. The device of claim 12, wherein the component collection device has a shape of a funnel.

16. The device of claim 12, wherein a top diameter of the cavity is in a range from 380 mm to 420 mm.

17. The device of claim 12, wherein the cavity comprises a first opening at a top of the component collection device and a second opening at a bottom of the component collection device, and the first opening is larger than the second opening.

18. The device of claim 17, further comprising:
  a box arranged under the second opening of the component collection device for collecting components falling out of the component collection device through the second opening.

19. A device for unpackaging components encased between a first tape body and a second tape body of a sealed tape, comprising:
  a component collection device having a shape of a funnel and comprising a cavity surrounded by a sidewall of the component collection device, the cavity for receiving components falling out of the sealed tape when the first tape body and the second tape body are being separated; and
  a de-taping structure comprising:
    a support arm attached to the sidewall of the component collection device and extending towards inner of the component collection device;
    a support base connected to the support arm and held over the cavity;
    a shaft mounted in a groove that is provided on a first side of the support base, wherein the shaft is along the first side; and
    a through-hole provided in the support base and extending between the first side of the support base and a second side of the support base, wherein the through-hole is configured for sealed tapes to pass through, and the first side is opposite to the second side; and
  wherein the support base with the shaft and the through-hole is configured to enable one tape body of the first tape body and the second tape body to be extendable around the shaft after the sealed tape is passed through the through-hole, and to be pulled using the support base as a support to separate from the other one of the first tape body and the second tape body over the cavity such that the components fall out of the sealed tape.

20. The device of claim 19, wherein the shaft is rotationally mounted on the support base.

* * * * *